(12) United States Patent
Zheng et al.

(10) Patent No.: US 7,267,892 B2
(45) Date of Patent: *Sep. 11, 2007

(54) ELECTROLUMINESCENT DEVICES HAVING PENDANT NAPHTHYLANTHRACENE-BASED POLYMERS

(75) Inventors: Shiying Zheng, Webster, NY (US); Kathleen M. Vaeth, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 315 days.

This patent is subject to a terminal disclaimer.

(21) Appl. No.: 11/092,473

(22) Filed: Mar. 29, 2005

(65) Prior Publication Data

US 2007/0187673 A1 Aug. 16, 2007

Related U.S. Application Data

(63) Continuation-in-part of application No. 10/786,812, filed on Feb. 25, 2004, now Pat. No. 6,899,963.

(51) Int. Cl.
*H01L 51/50* (2006.01)

(52) U.S. Cl. ............... 428/690; 428/917; 313/504; 313/506; 427/66; 252/301.16; 257/40

(58) Field of Classification Search ........ 428/690, 428/917; 313/504, 506; 427/66; 252/301.16; 257/40
See application file for complete search history.

(56) References Cited

U.S. PATENT DOCUMENTS 6,361,887 B1 * 3/2002 Shi et al. ............... 428/690

(Continued)

FOREIGN PATENT DOCUMENTS

JP 2003-338375 * 11/2003

(Continued)

OTHER PUBLICATIONS

Burroughes et al, Light-emitting diodes based on conjugated polymers, Nature 1990, 347, 539-541.

(Continued)

*Primary Examiner*—Dawn L. Garrett
(74) *Attorney, Agent, or Firm*—Raymond L Owens

(57) ABSTRACT

A naphthylanthracene-based polymer comprising a repeating unit of the formula

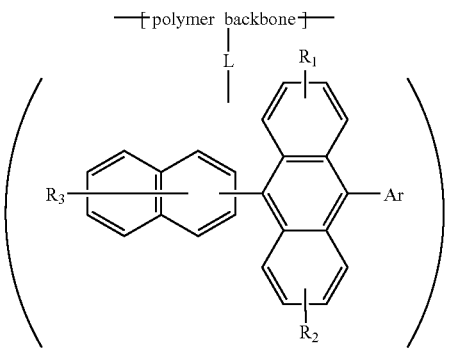

wherein:
Ar is an aryl or substituted aryl of from 6 to 60 carbon atoms; or a heteroaryl or substituted heteroaryl of from 4 to 60 carbon atoms;
$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group; and
L is a direct bond between naphthylanthracene and polymer backbone or a carbon linking group having 1 to 40 carbon atoms or a non-carbon linking group.

9 Claims, 2 Drawing Sheets

U.S. PATENT DOCUMENTS

| | | | |
|---|---|---|---|
| 6,638,644 B2* | 10/2003 | Zheng et al. | 428/690 |
| 6,849,348 B2* | 2/2005 | Zheng et al. | 428/690 |
| 6,899,963 B1* | 5/2005 | Zheng et al. | 428/690 |
| 2001/0026879 A1* | 10/2001 | Chen et al. | 428/690 |
| 2006/0040137 A1* | 2/2006 | Kambe et al. | 428/690 |

OTHER PUBLICATIONS

Sheats etal, Organic Electroluminescent Devices, Science 1996, 273, 884-888.

Berggren et al, Light-emitting diodes with variable colours from polymer blends, Nature 1994, 372, 444-6.

Spreitzer et al, Soluble Phenyl-substituted PPVs-New Materials for Highly Efficient Polymer LEDs, Adv. Mater. 1998, 10(16) 1340-1343.

Li et al, A blue light emitting copolymer with charge transporting and photo-crosslinkable functional units, Sny. Met. 1997, 84, 437-438.

Yang et al, Polyaniline as a transparent electrode for polymer light-emitting diodes: Lower operating voltage and high efficiency, Appl. Phys. Lett. 1994, 64, 1245-1247.

Groenendaal, et al, Poly(3,4-ethyelnedioxythiophene) and Its Derivatives: Past, Present and Future, Adv. Mater. 2000, 12, 481-494.

* cited by examiner

ELECTROLUMINESCENT DEVICES HAVING PENDANT NAPHTHYLANTHRACENE-BASED POLYMERS

CROSS REFERENCE TO RELATED APPLICATIONS

This is a continuation-in-part of application Ser. No. 10/786,812, filed Feb. 25, 2004, now U.S. Pat. No. 6,899,963 entitled "Electroluminescent Devices Having Pendant Naphthylanthracene-Based Polymers" by Shiying Zheng, et al.

FIELD OF THE INVENTION

The present invention relates to naphthylanthracene-based polymers that are suitable for use in organic electroluminescent devices.

BACKGROUND OF THE INVENTION

Large area solid state light sources have application in display elements and lighting sources. Electroluminescent device such as light-emitting diodes (LED) represents an alternative to conventional display and lighting elements. Electroluminescent devices are opto-electronic devices where light emission is produced in response to an electrical current through the device. The physical model for EL is the radiative recombination of electrons and holes. Both organic and inorganic materials have been used for the fabrication of LEDs. Inorganic materials such as ZnS/Sn, Ga/Bs, Ga/As have been used in, e.g. semiconductor lasers, small area displays, and LED lamps. However, the drawbacks of inorganic materials include difficulties to process and to obtain large surface areas and efficient blue light.

Organic materials offer several advantages over inorganic materials for LEDs, such as simpler manufacturing, low operating voltages, the possibility of producing large area and full-color displays. Conjugated polymers such as poly (phenylvinylene) (PPV) were first introduced as EL materials by Burroughes et al. in 1990 (Burroughes, J. H. *Nature* 1990, 347, 539-41). Progress has been made since then to improve the stability, efficiency, and durability of polymeric LEDs (Bernius, M. T. et al., *Adv. Mater.* 2000, 12, 1737). Organic LED (OLED) represents an alternative to the well-established display technologies based on cathode-ray tubes and liquid crystal displays (LCDs), especially for large area displays. OLED has been demonstrated to be brighter, thinner, lighter, and faster than LCDs. Moreover it requires less power to operate, offers higher contrast and wide viewing angle (>165 degree), and has great potential to be cheaper to make, especially the solution processable polymer-based LEDs (PLED). Polymers with wide energy band gap to emit blue light are important materials because stable, efficient blue-light-emitting materials with high brightness are desirable for full color EL display applications. With these primary materials, it is possible to produce other colors by a downhill energy transfer process. For instance, a green or red EL emission can be obtained by doping a blue EL host material with a small amount of green or red luminescent material.

Incorporating an efficient chromophore into a polymer side chain is an effective approach to obtain blue light-emitting polymer. The main chain of the polymer can provide necessary physical properties such as mechanical and film-forming properties and the side chain provides desired electro-optical properties. Blue-light-emitting polymers (Li et al. *Syn. Met.* 1997, 84, 437) have been prepared by this approach. However, the polymers show high threshold voltages and operating voltages. Thus, it is desirable to develop processable new blue-light-emitting polymers with low driving voltages for full color display.

SUMMARY OF THE INVENTION

It is an object of the present invention to provide highly efficient organic material.

It is another object of the present invention to provide wide energy band gap organic materials useful for EL devices.

It is a further object of the present invention to provide emissive organic material that is highly effective in electroluminescent devices.

These objects are achieved by providing the following organic materials for an organic electroluminescent device. The organic materials comprise pendant naphthylanthracene-based polymers having a repeating unit of the formula

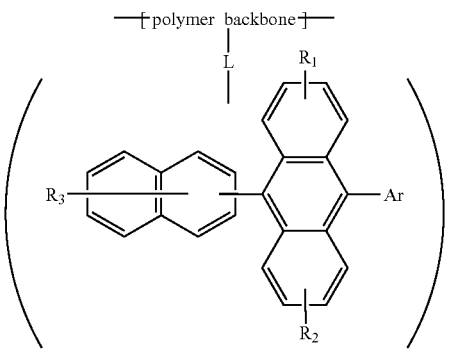

wherein:

Ar is an aryl or substituted aryl of from 6 to 60 carbon atoms; or a heteroaryl or substituted heteroaryl of from 4 to 60 carbon atoms;

$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group; and L is a direct bond between naphthylanthracene and polymer backbone or a carbon linking group having 1 to 40 carbon atoms or a non-carbon linking group having 0 to 40 carbon atoms.

The present invention provides polymeric luminescent materials with a number of advantages that include effective solubility and efficiency and better thermal stability. With the primary wide energy band gap chromophore, naphthylanthracene such as 9,10-dinaphthylanthracene, other color emitting luminescent copolymers can be readily designed and produced by introducing the narrow energy band gap chromophores into the polymeric chain.

DETAILED DESCRIPTION OF THE INVENTION

Figure 1:
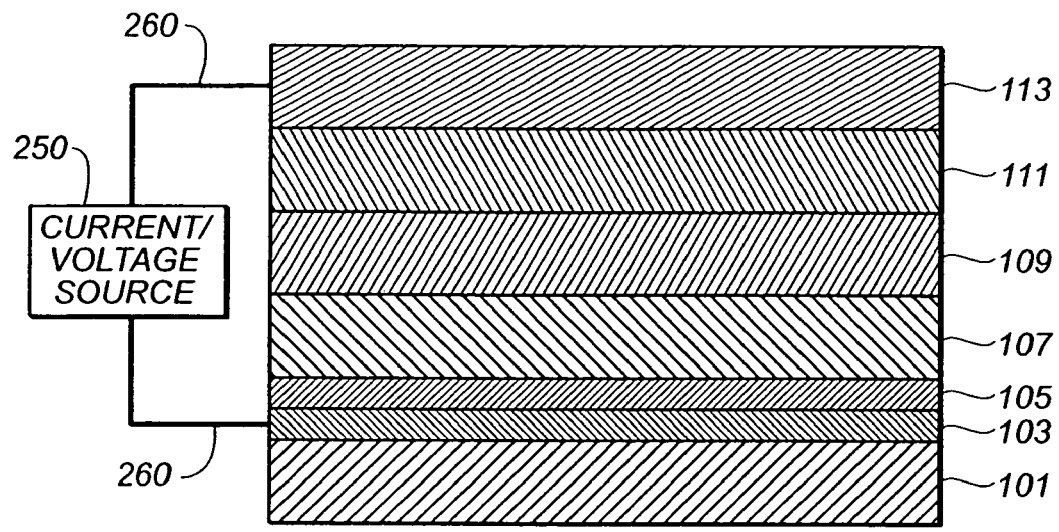
FIG. 1 illustrates in cross-section a basic structure of an EL device.

The chromophore naphthylanthracene such as 9,10-dinaphthyl-anthracene has been shown to be particularly useful for the fabrication of efficient and stable EL devices as disclosed in U.S. Pat. Nos. 5,935,721 and 6,361,887. Furthermore, naphthylanthracene chromophore has a wide energy band gap and emits blue light. By rational design of a polymer structure, the green- or red-light-emitting polymer can be obtained through intramolecular downhill energy transfer in a copolymer.

The present invention provides highly efficient light-emitting polymers containing naphthylanthracene with effective solubility and thermal stability having the repeating units represented by the Formula

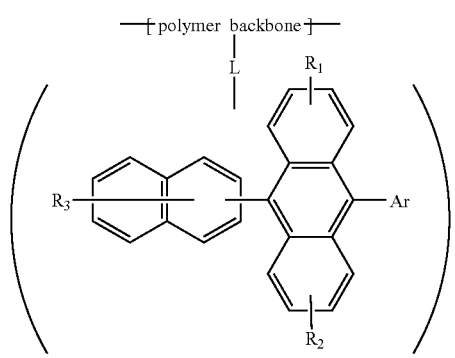

(I)

wherein:

Ar is an aryl or substituted aryl of from 6 to 60 carbon atoms that includes phenyl, biphenyl, naphthyl, anthracene, fluorene, benzofluorene, dibenzofluorene, phenanthrene, spirofluorene, perylene, or pyrene groups or a heteroaryl or substituted heteroaryl of from 4 to 60 carbon atoms that includes pyridine, thiophene, pyrrole, bithiophene, furan, benzofuran, benzimidazole, benzoxazole, quinoxaline, phenylquinoline, diphenyloxadiazole, diphenylthiodiazole, phenanthroline, or carbazole. Preferably, Ar is phenyl, biphenyl, naphthyl, or fluorene, thiophene, or anthracene;

$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group;

L is a direct bond between naphthylanthracene and polymer backbone or a carbon linking group having from 1 to 40 carbon atoms or a non-carbon linking group. A non-carbon linking group means a group with one or more non-carbon atoms that can be connected to carbon atoms; and $R_1$, $R_2$, and $R_3$ are the same or different, and are each individually hydrogen, or alkyl, or alkenyl, or alkynyl, or alkoxy, or amino wherein alkyl, alkenyl, alkynyl, alkoxy or amino can have from 1 to 40 carbon atoms; or aryl of from 6 to 60 carbon atoms; or heteroaryl of from 4 to 60 carbons; or F, or Cl, or Br; or a cyano group; or a nitro group; aryl of from 6 to 60 carbon atoms that includes phenyl, biphenyl, naphthyl, anthracene, fluorene, benzofluorene, dibenzofluorene, phenanthrene, spirofluorene, perylene, or pyrene groups, or a heteroaryl of from 4 to 60 carbon atoms that includes pyridine, thiophene, pyrrole, bithiophene, furan, benzofuran, benzimidazole, benzoxazole, quinoxaline, phenylquinoline, diphenyloxadiazole, diphenylthiodiazole, phenanthroline, or carbazole; For example, $R_1$, $R_2$, and $R_3$ represent hydrogen, methyl, ethyl, propyl, isopropyl, butyl, isobutyl, t-butyl, pentyl, hexyl, ethylhexyl, heptyl, octyl, nonyl, decyl, dodecyl, hexadecyl, cyclohexyl, cyclopentyl, 3,7-dimethyloctyl, 3,7-dimethyloctyloxy, methoxy, ethoxy, butoxy, methoxyethoxyethyl, methoxyethyloxyethoxyethyl, hexyloxy, ethylhexyloxy, diphenylamino, ditolylamino, di-(4-t-butylphenyl)amino, phenyl, tolyl, naphthyl, xylenyl, anthracene, phenanthrene, phenylmethylenephenyl, benzyl, phenoxy, pyridyl, thiophenyl. Preferably, $R_1$, $R_2$, $R_3$ are hydrogen, t-butyl, phenyl, 2-ethylhexyloxy, n-hexyl, n-octyl, 3,7-dimethyloctyl, 3,7-dimethyloctyloxy, diphenylamino, ditolylamino, dimethoxylphenylamino, di-(methoxycarbonylphenyl)amino, di-(4-t-butylphenyl)amino, or 4-methoxypheny.

When L is a linking group, it includes alkyl, alkenyl, alkynyl, aryl, or heteroaryl; L can also contain O, N, S, F, Cl, or Br, or Si atoms. L includes but are not limited to the following groups:

Group I:

L is an ether, or thioether linking group:

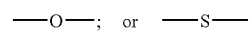

Group II:

L is an ester linking group:

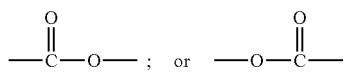

Group III:

L is an anhydride linking group:

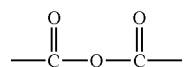

Group IV:
 L is a carbonate linking group:

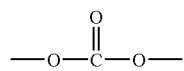

Group V:
 L is a sulfone or sulfine linking group:

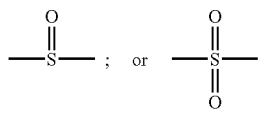

Group VI:
 L is an amino or silo linking group:

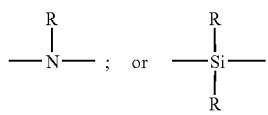

wherein:
 R is hydrogen, or alkyl, or alkoxy wherein alkyl or alkoxy can have from 1 to 40 carbon atoms; or aryl of from 6 to 60 carbon atoms; or heteroaryl of from 4 to 60 carbons; or F, or Cl, or Br; or a cyano group; or a nitro group.

Group VII:
 L is an amide linking group:

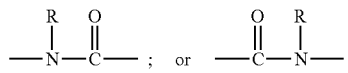

Group VIII:
 L is a urea linking group:

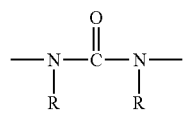

Group IX:
 L is an alkyl, alkenyl, or alkynyl group:

—Y— wherein:
 Y contains 1 to 40 carbon atoms, can also contain O, N, S, F, Cl, Br, or Si atoms.

Group X:
 L is an aryl or heteroaryl linking group:

—(Ar₁)ₘ— wherein:
 Ar$_1$ is an aryl group having 6 to 60 carbon atoms, or heteroaryl group having 4 to 60 carbon atoms, and at least one or more N, S, or O atoms; and
 m is an integer of 1 to 4.
 The following structures constitute specific examples of L in Group X:

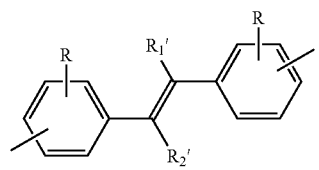

wherein:
 R$_1$' and R$_2$' are the same or different, and are each individually hydrogen, or alkyl, or alkoxy wherein alkyl or alkoxy can have from 1 to 40 carbon atoms; or aryl of from 6 to 60 carbon atoms; or heteroaryl of from 4 to 60 carbons; or F, or Cl, or Br; or a cyano group; or a nitro group;

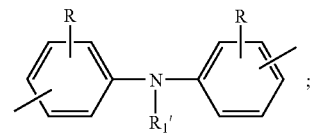

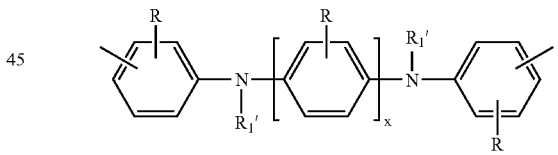

wherein:
 x is an integer of 1 to 3;

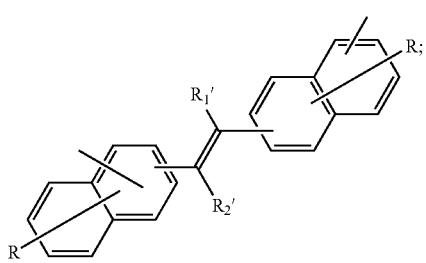

carbon atoms; or aryl of from 6 to 60 carbon atoms; or heteroaryl of from 4 to 60 carbons; or F, Cl, or Br; or a cyano group; or a nitro group;

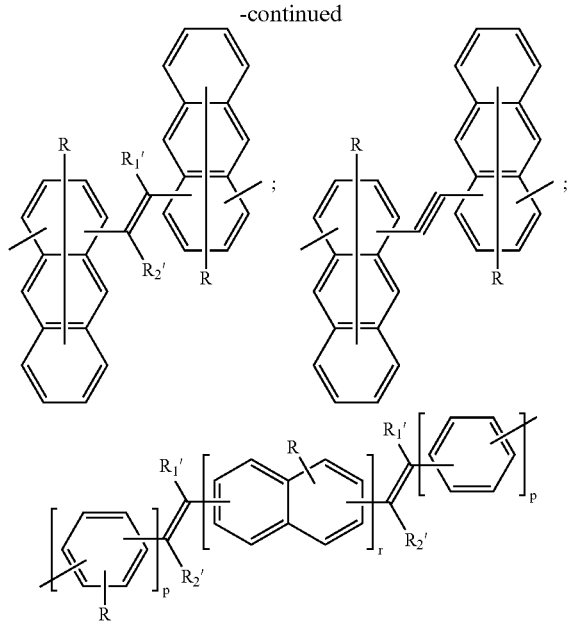

wherein:
p and r are integers from 1 to 4;

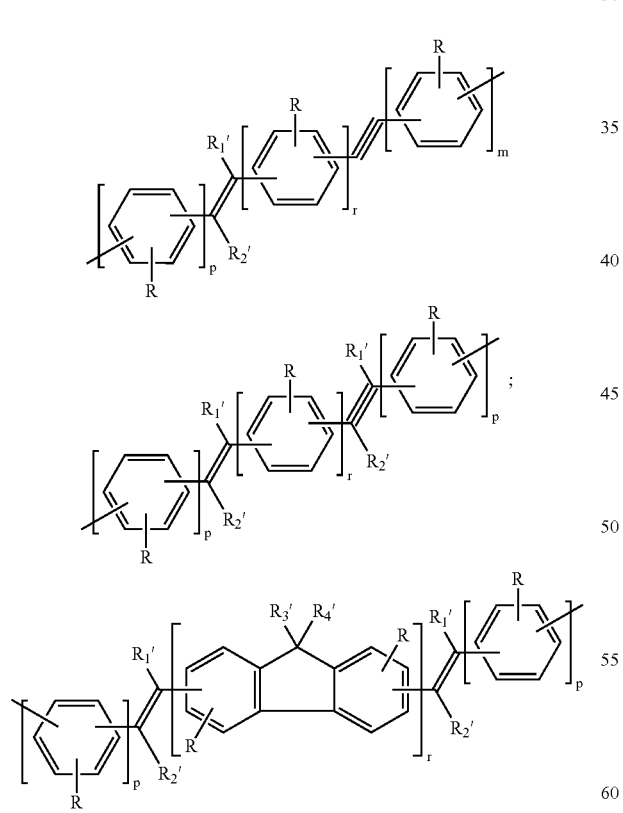

wherein:
$R_3'$ and $R_4'$ are substituents each being individually hydrogen, or alkyl, or alkenyl, or alkynyl, or alkoxy wherein alkyl, alkenyl, or alkynyl, or alkoxy can have from 1 to 40 wherein:
$X_2$ is S, Se, or O atom, $SiR_2$, or N—R;

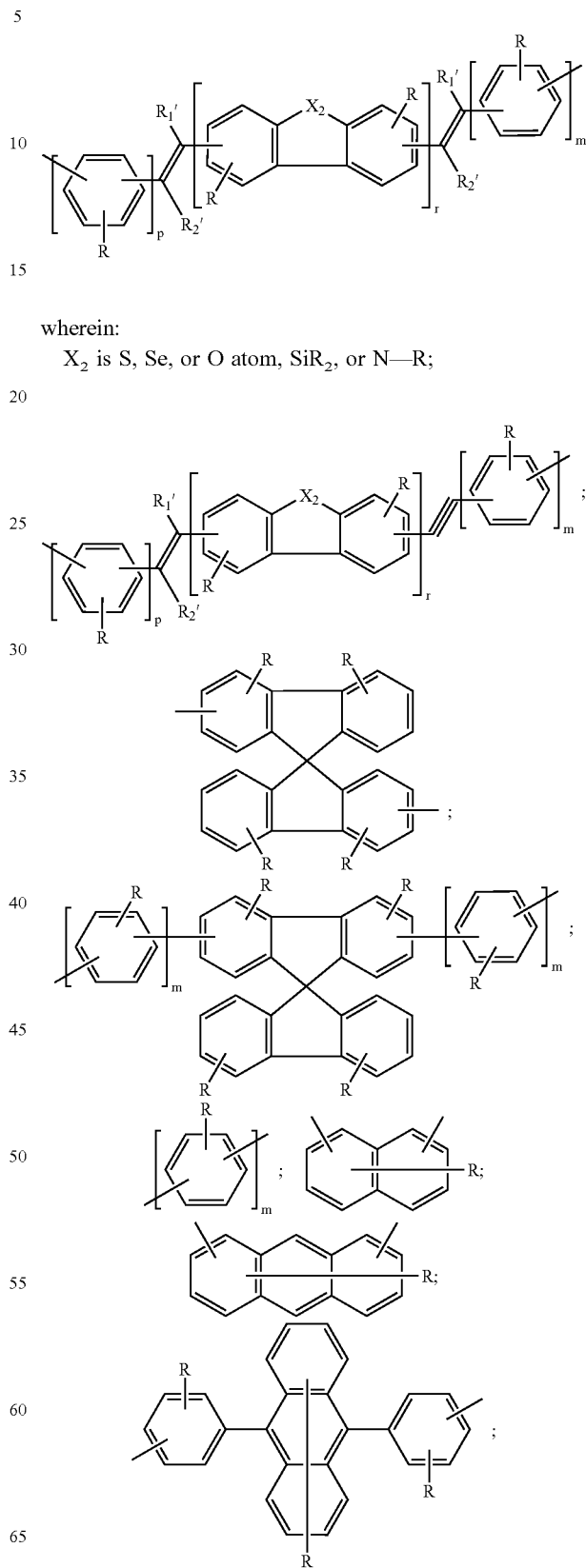

-continued
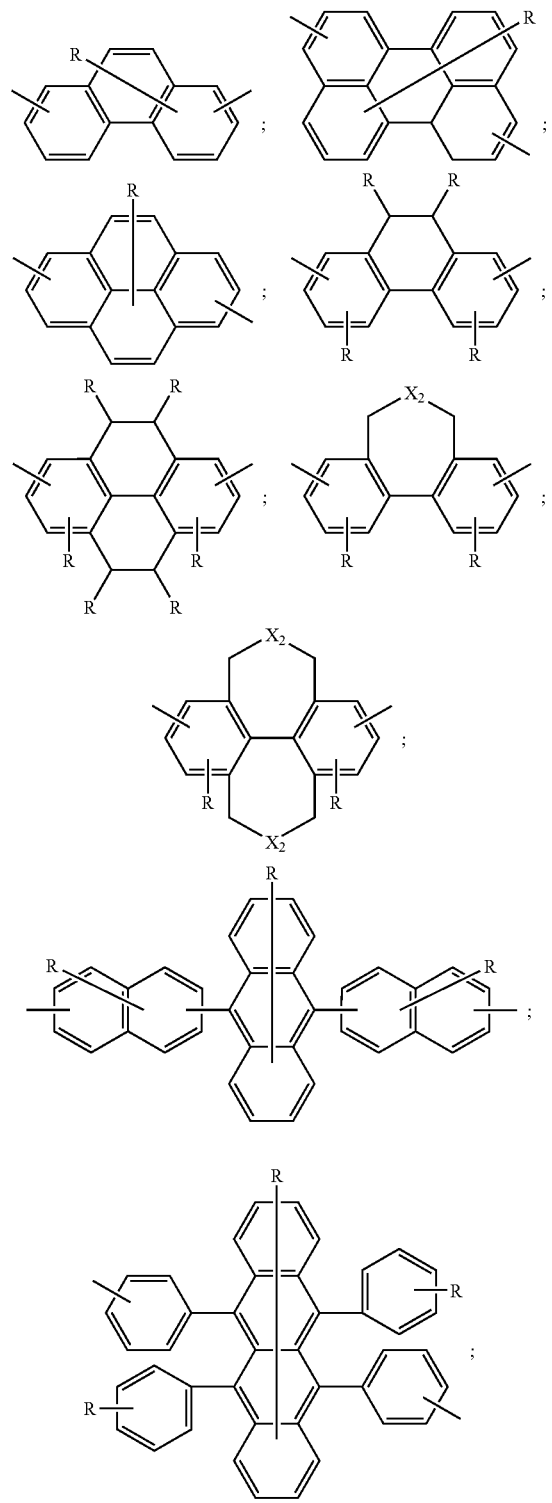
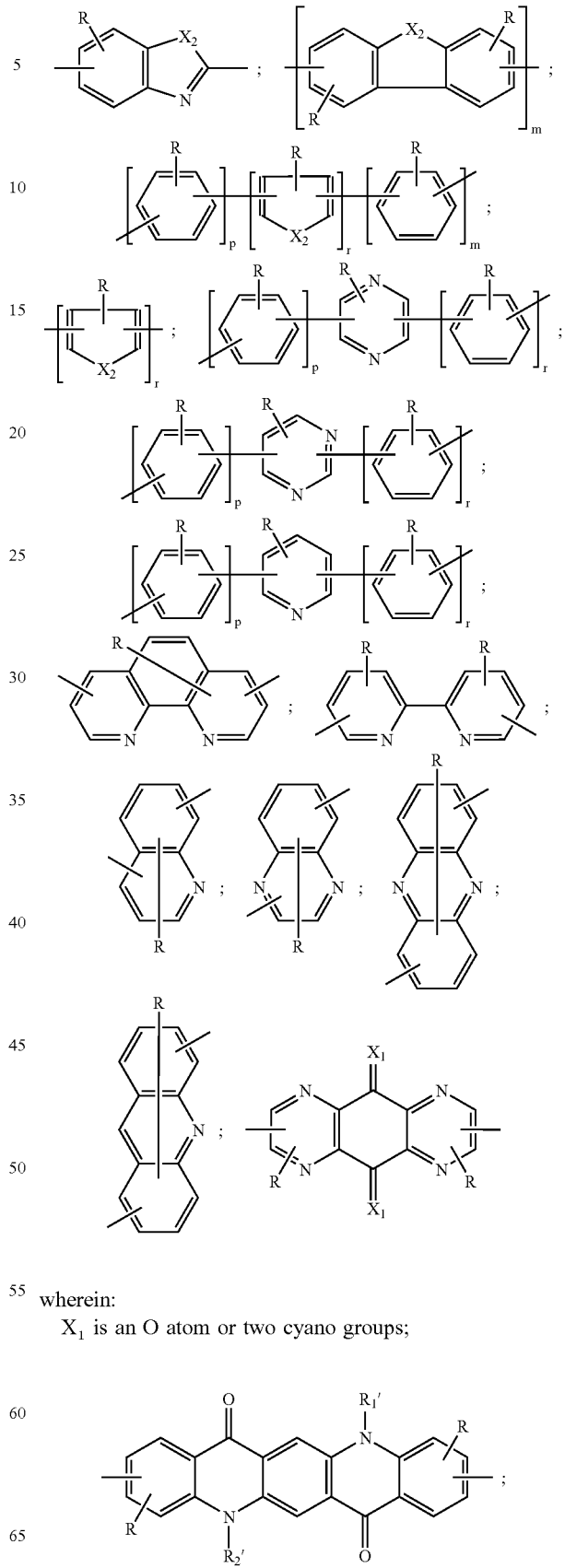
wherein:
X₁ is an O atom or two cyano groups;

-continued

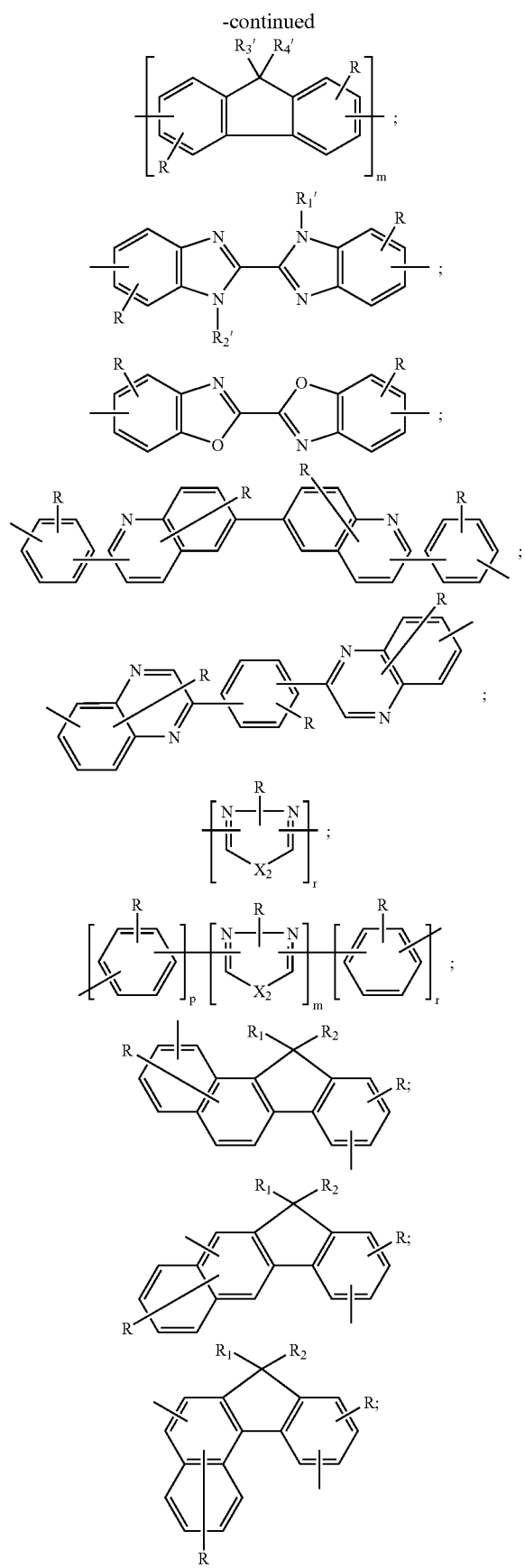

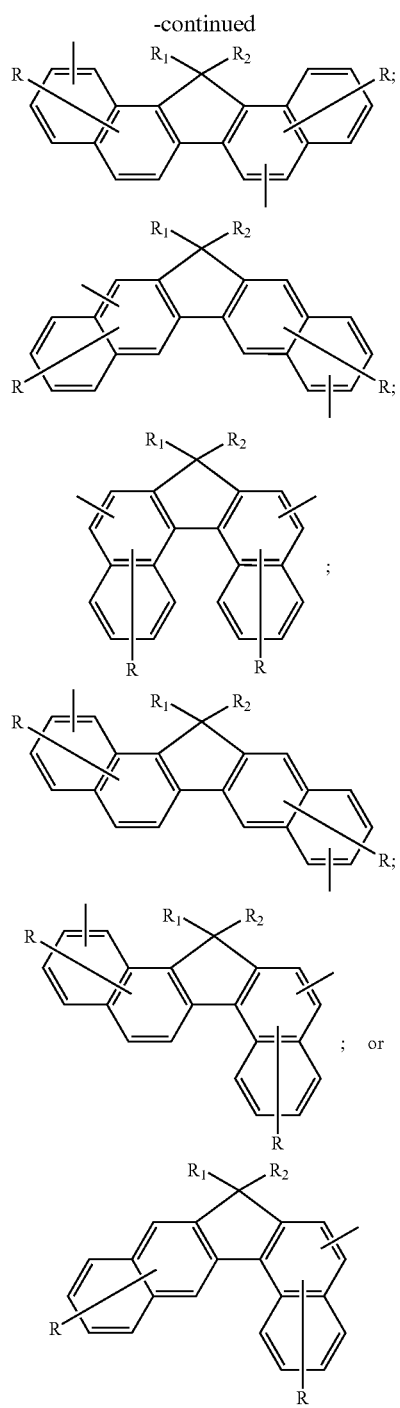

L can be one or the combination of more than one of the above groups.

The polymer backbone can be vinyl polymer backbone, polyether, polythioether, polyamine, polyacetylene, polycarbonate, polyurethane, polysulfone, polyimide, polyamide, polyurea, poly(ether ketone), polyester, polyketone, polysiloxane, polyarene, poly(arylene vinylene), or poly(arylene acetylene). Preferably, the polymer backbone is a poly(arylene vinylene), a polyarene, or a vinyl polymer backbone.

The following molecular structures constitute specific examples of the preferred polymers satisfying the requirement of this invention:
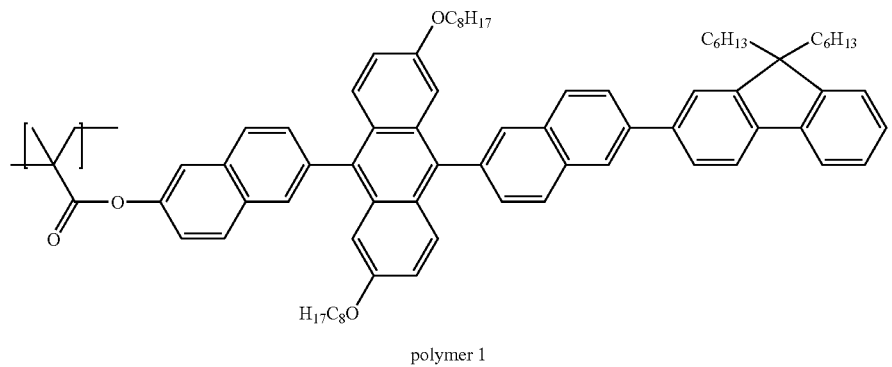
polymer 1
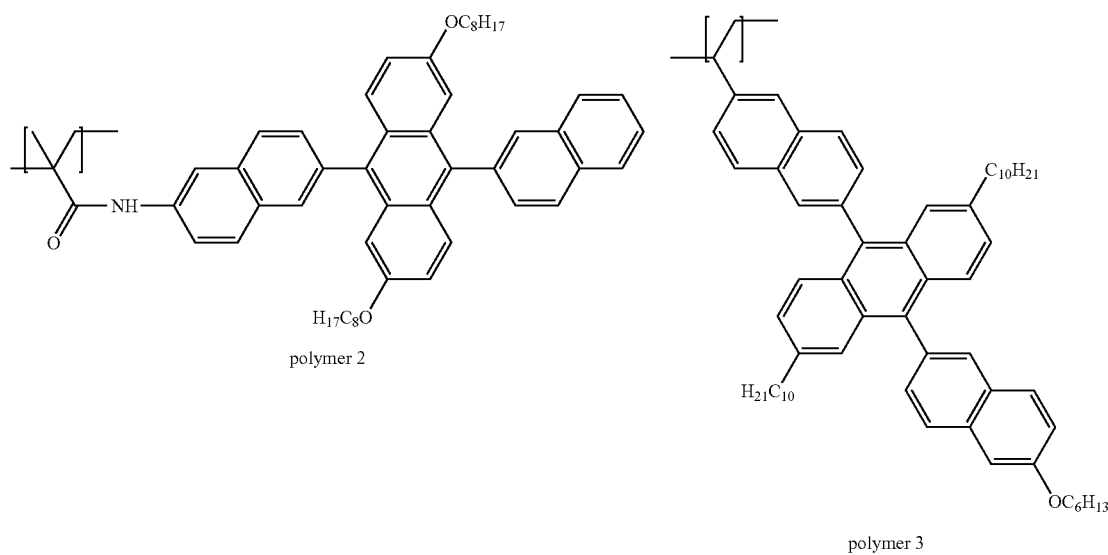
polymer 2
polymer 3
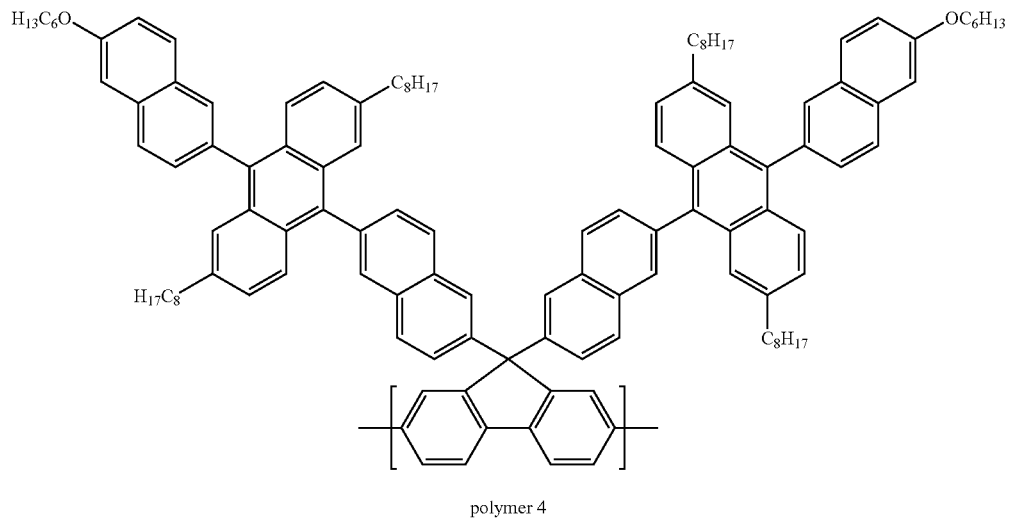
polymer 4

-continued
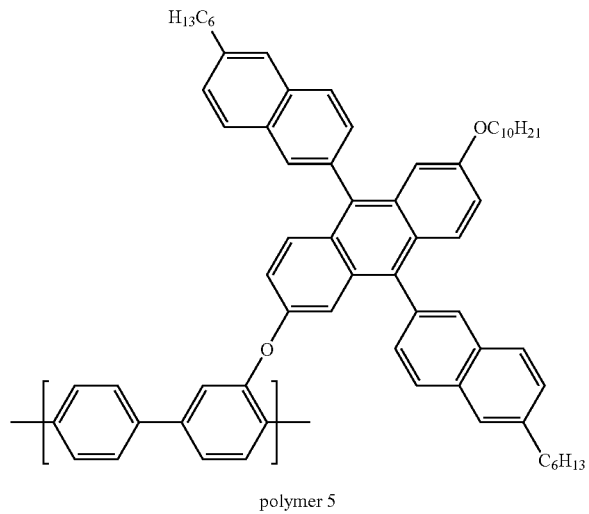
polymer 5
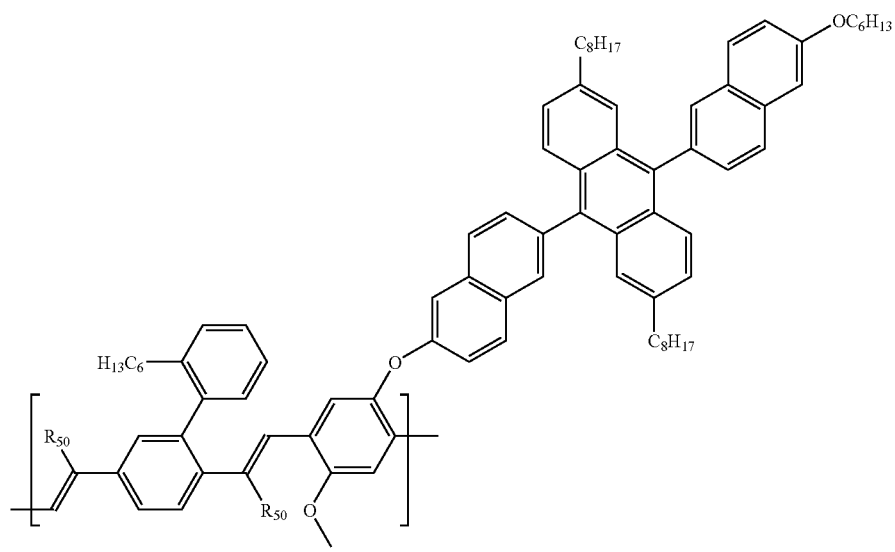
polymer 6 R₅₀ = H
polymer 7 R₅₀ = CN
polymer 8 R₅₀ = phenyl

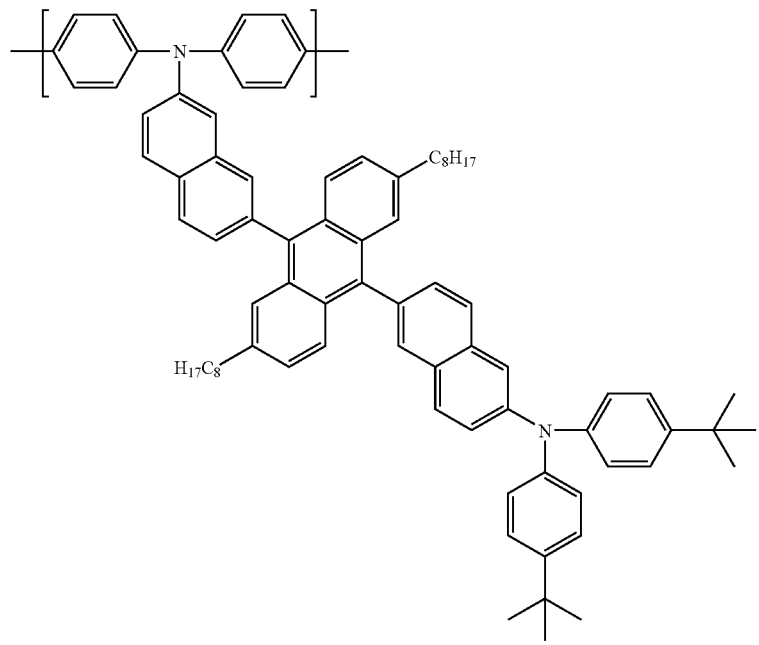
polymer 9
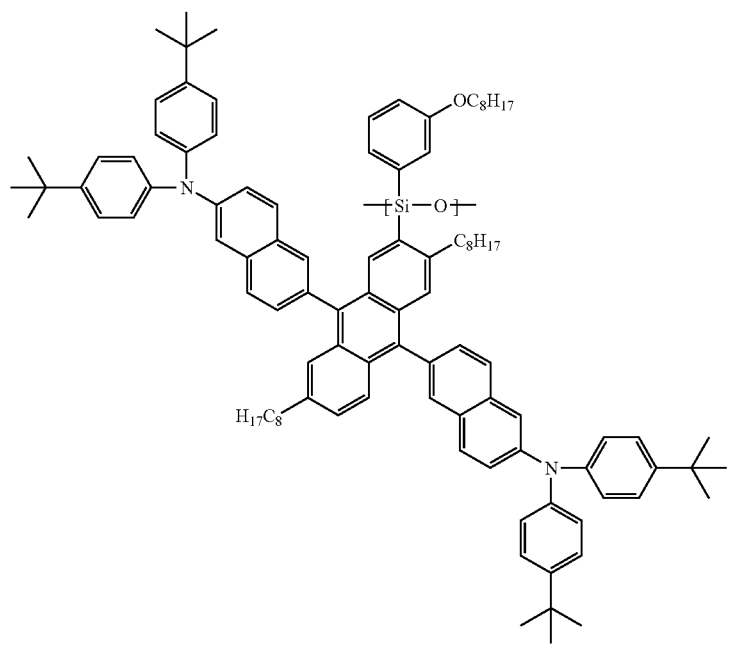
polymer 10

-continued
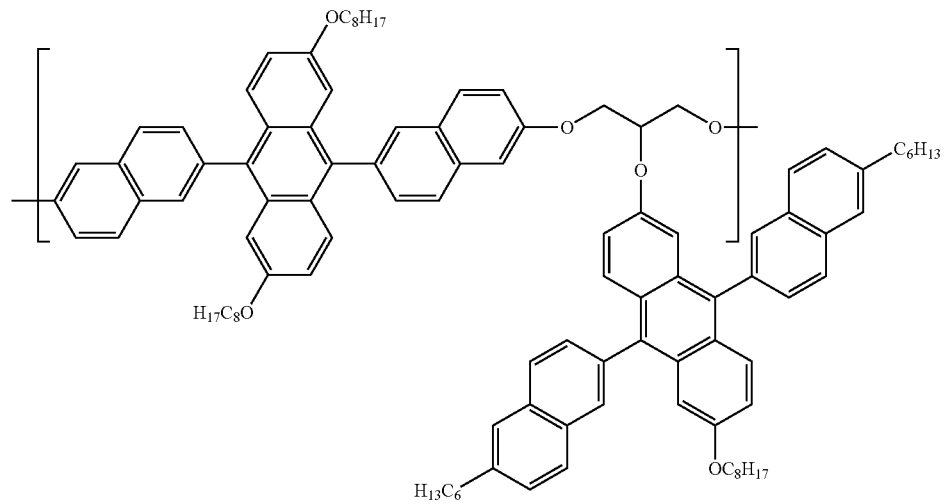
polymer 11
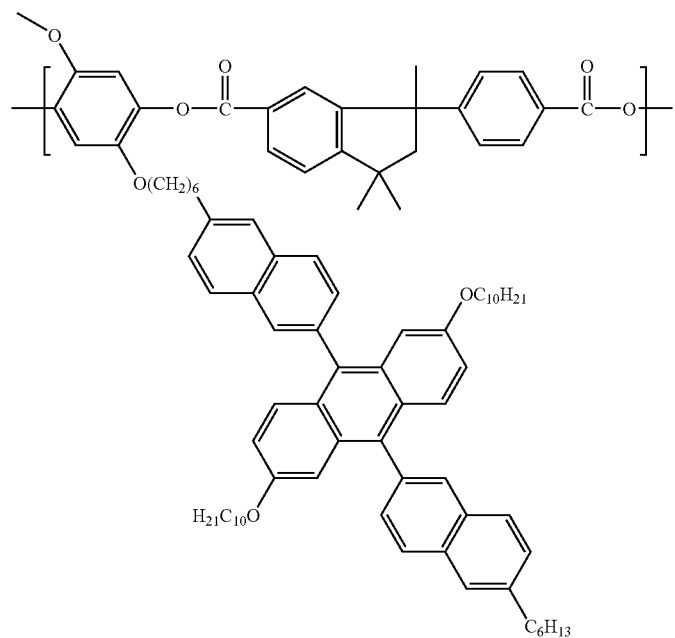
polymer 12

-continued
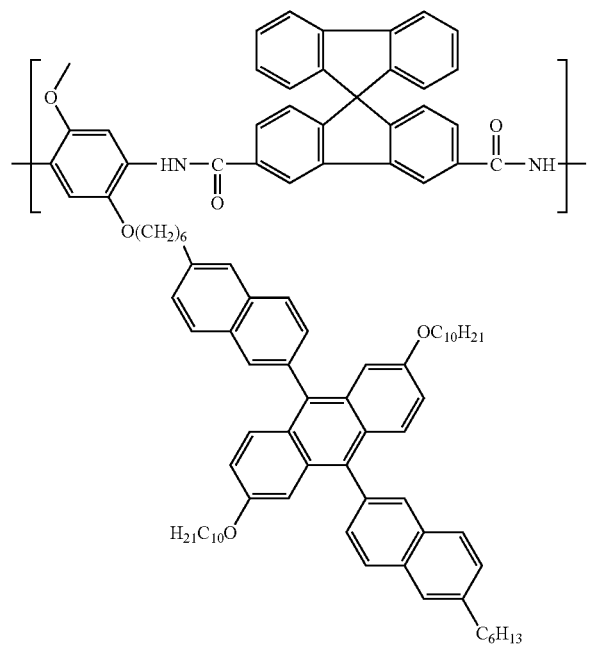
polymer 13
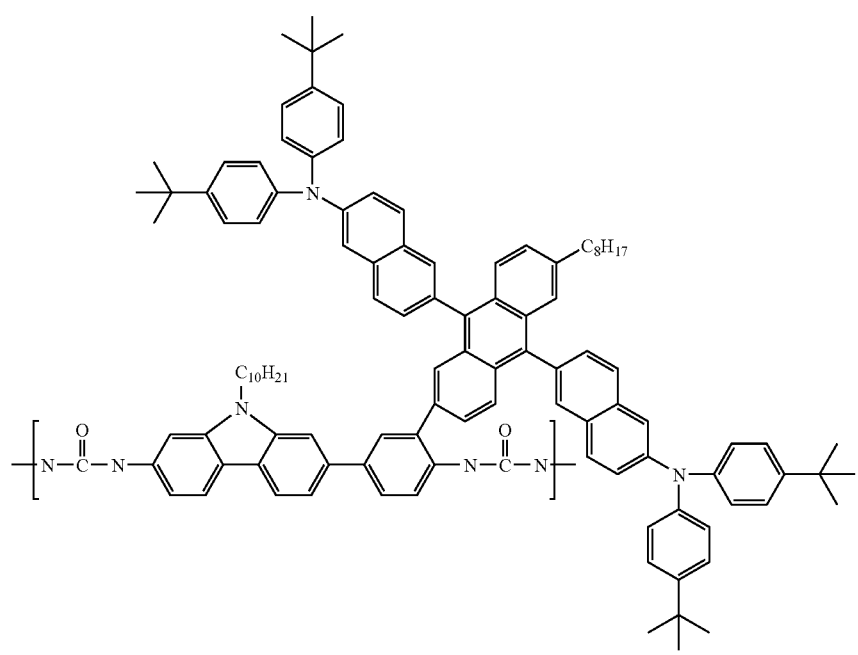
polymer 14

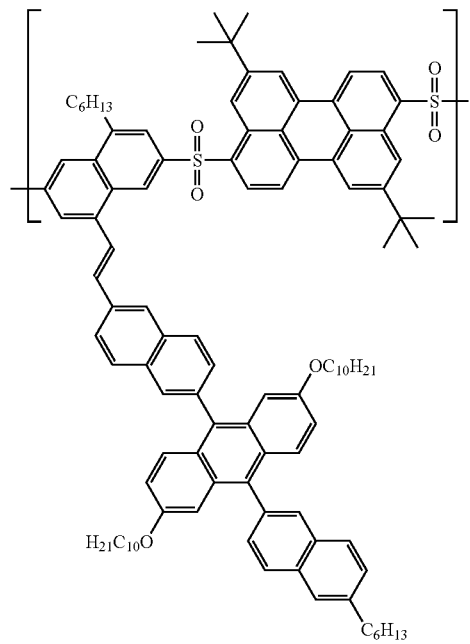
polymer 15
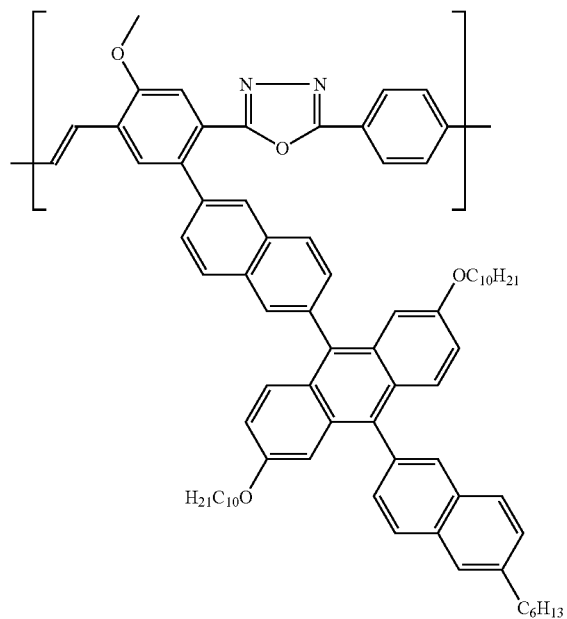
polymer 16

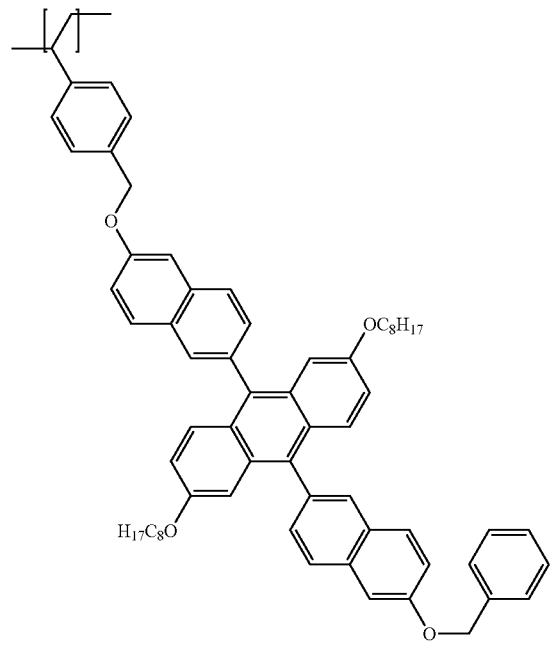
polymer 17
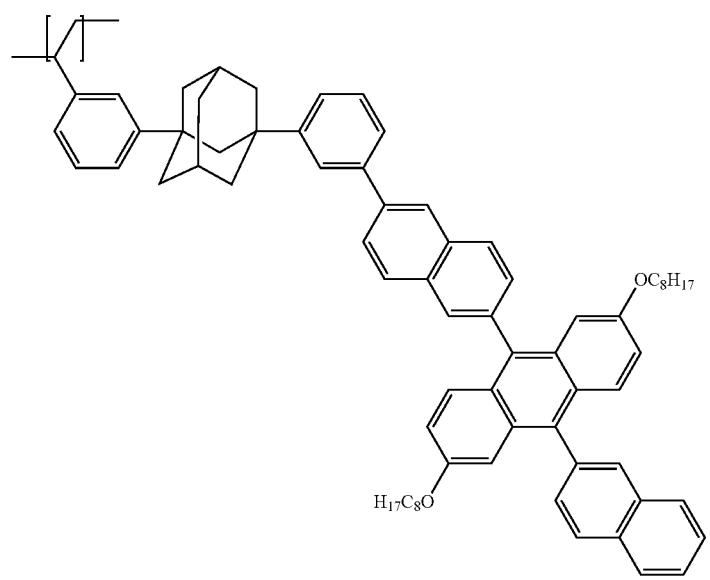
polymer 18

-continued
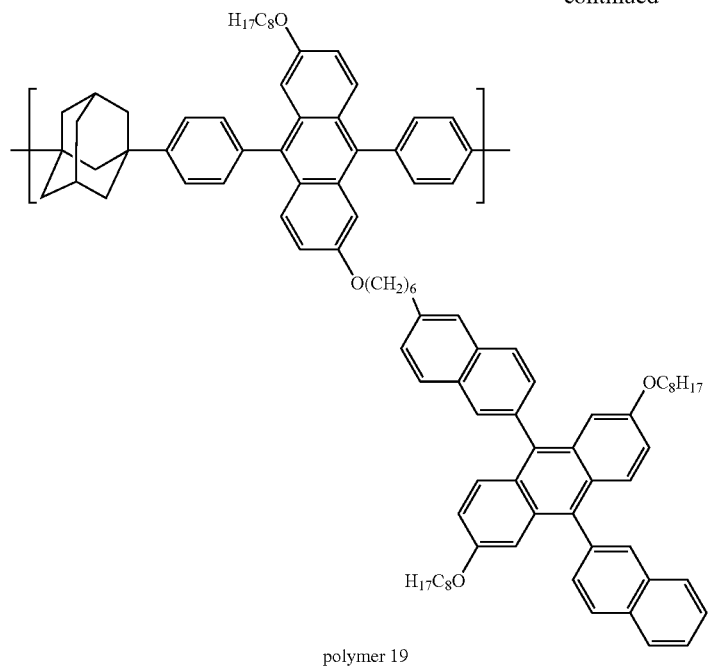
polymer 19
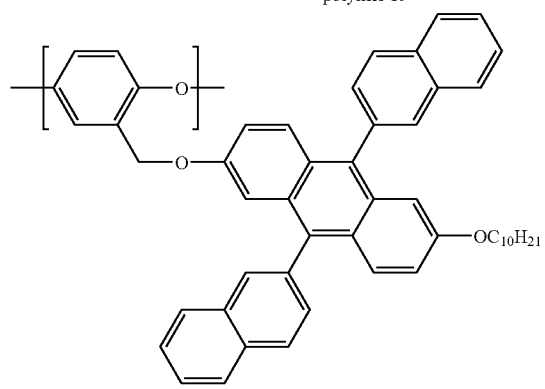
polymer 20
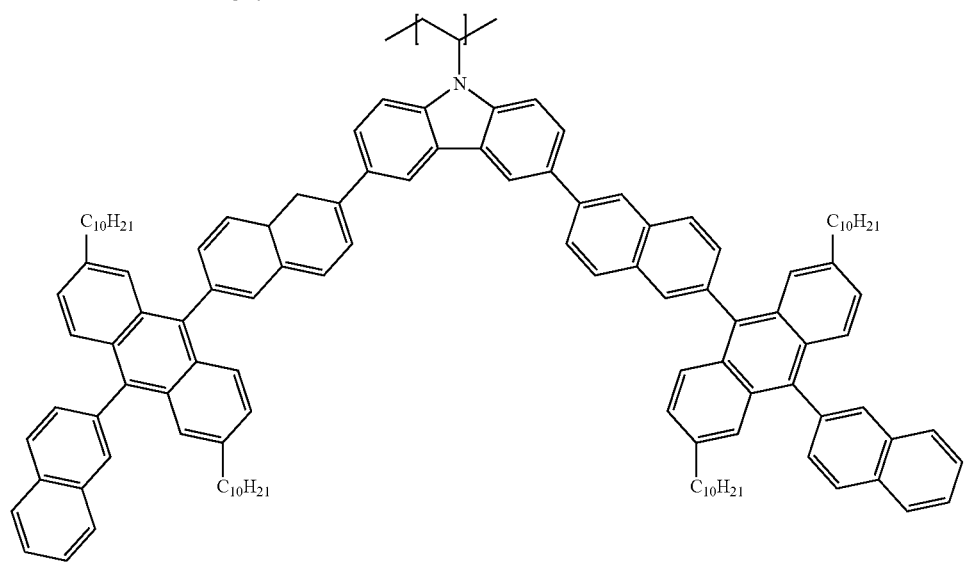
polymer 21

-continued
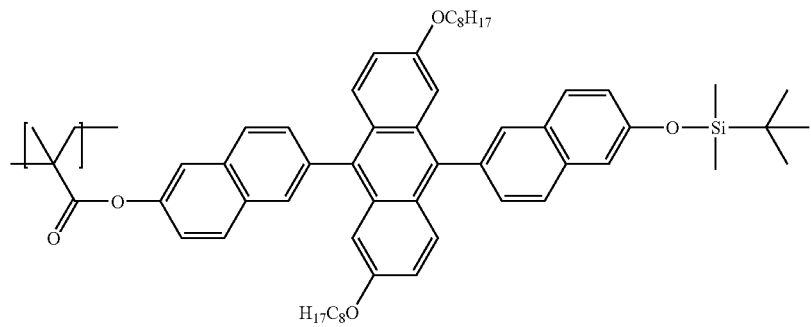
polymer 22
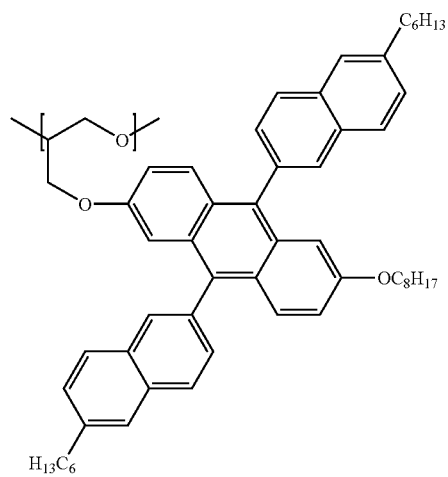
polymer 23
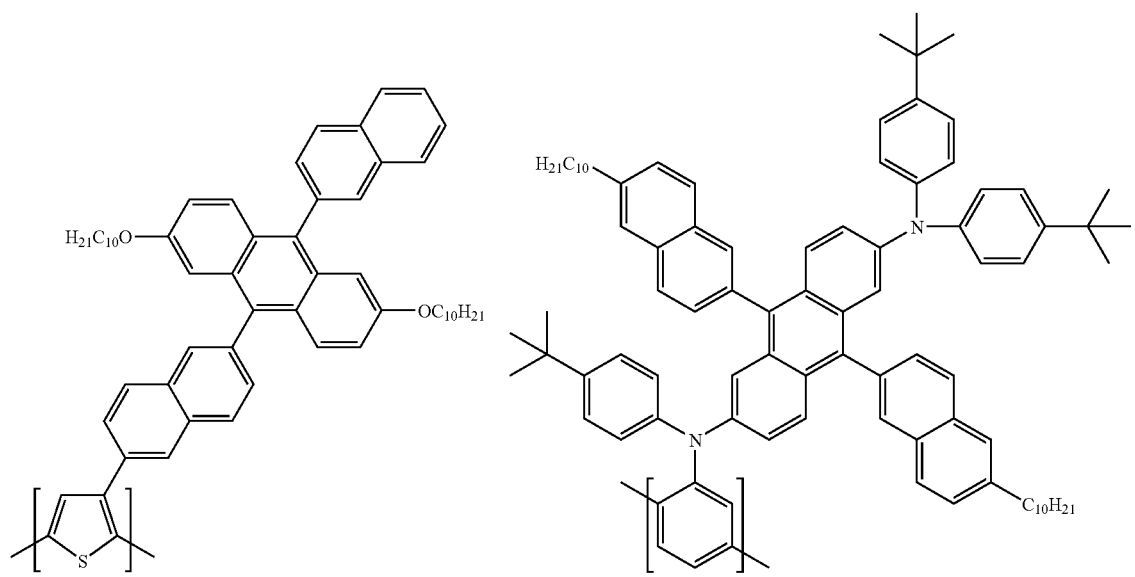
polymer 24
polymer 25

-continued
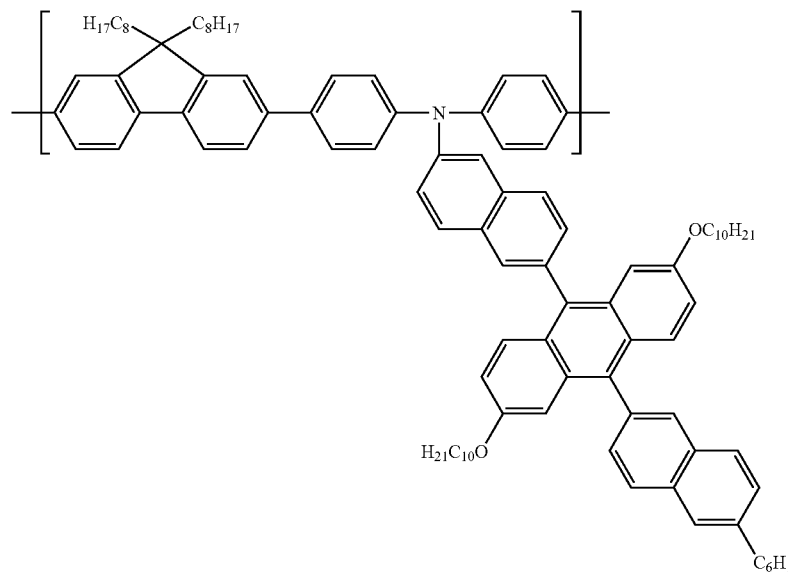
polymer 26
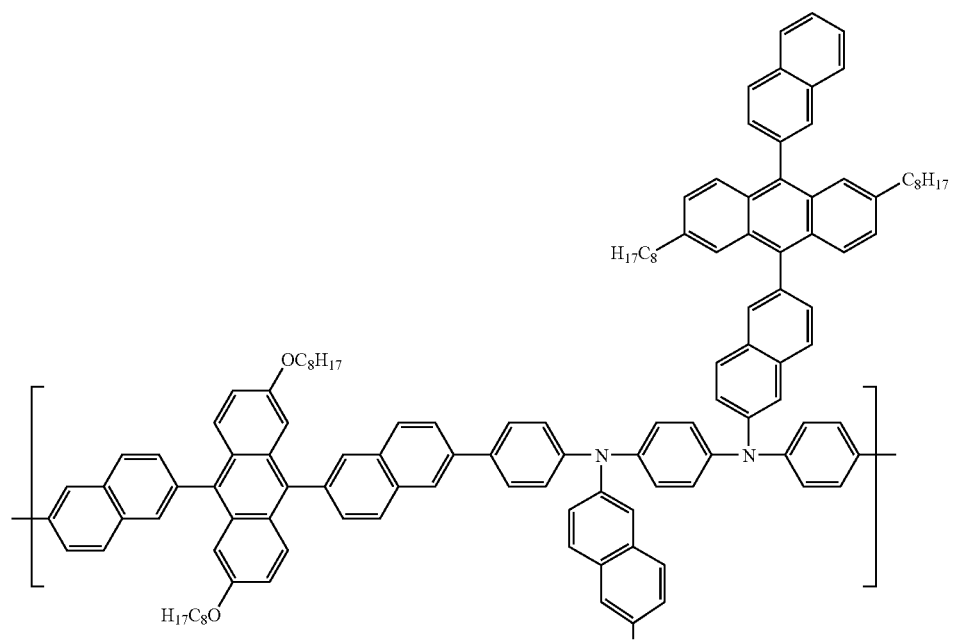
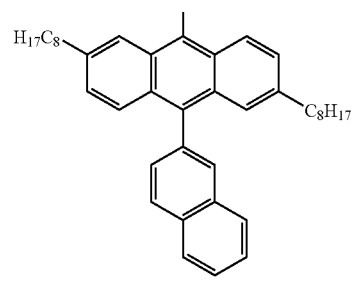
polymer 27

-continued
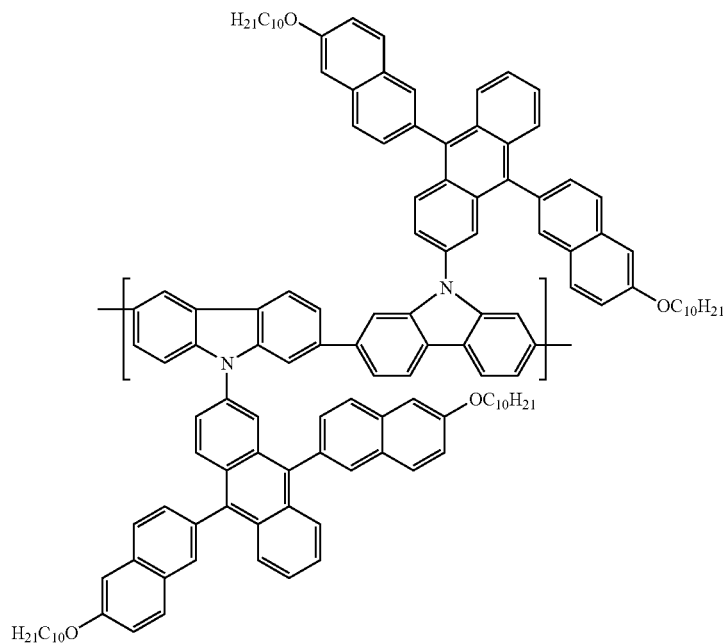
polymer 28
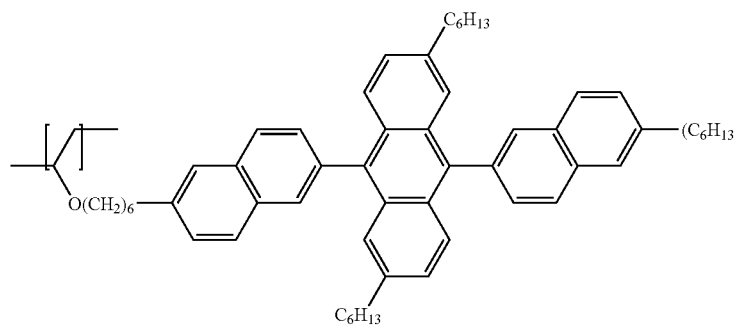
polymer 29
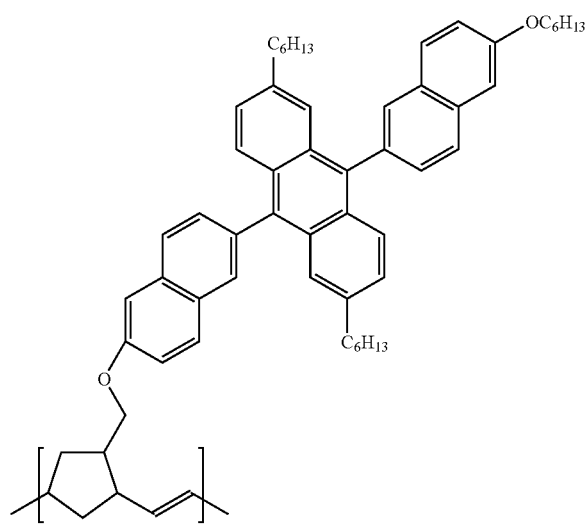
polymer 30

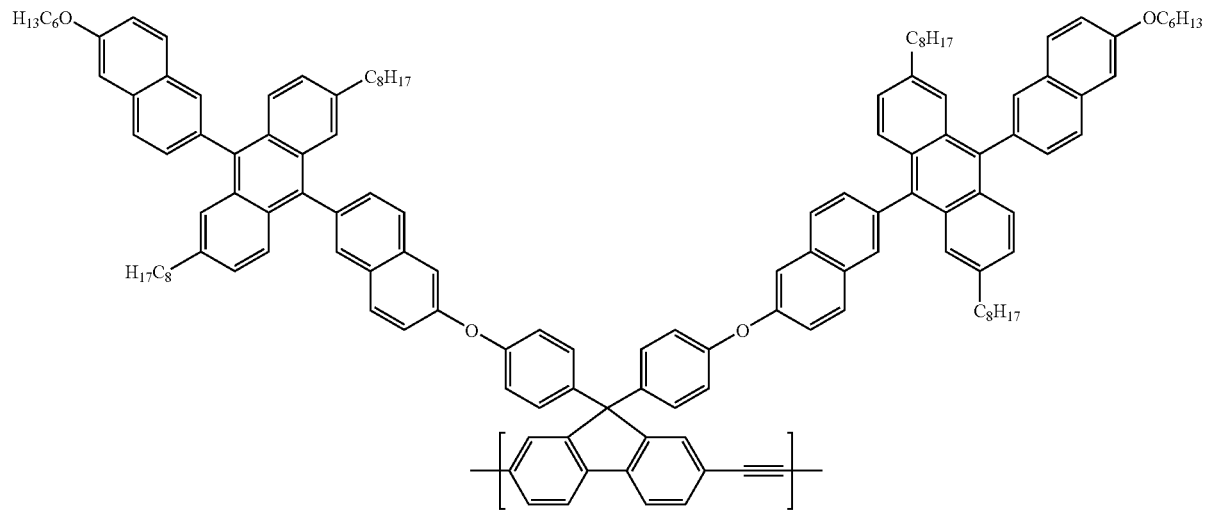
polymer 31
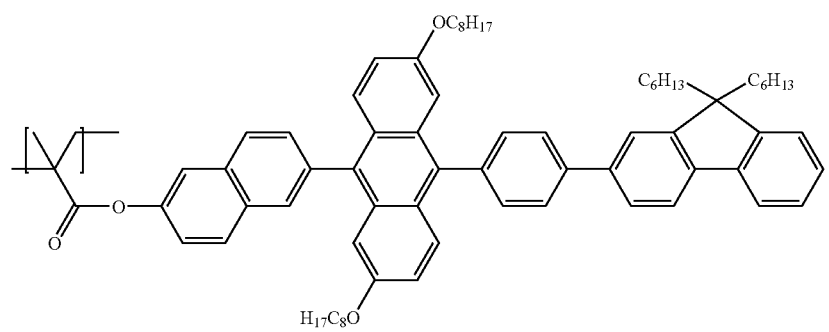
polymer 32
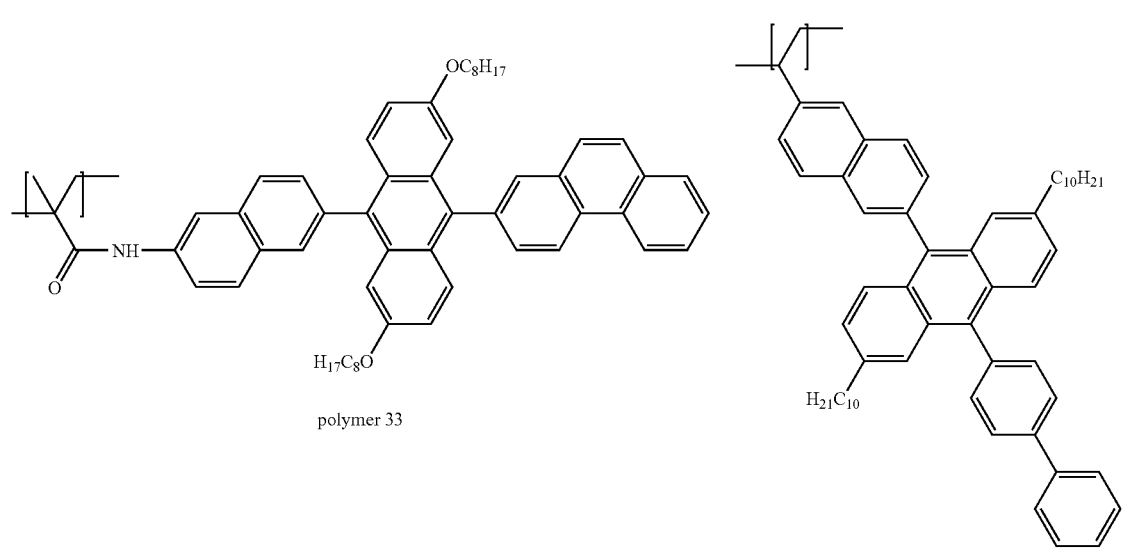
polymer 33
polymer 34

-continued
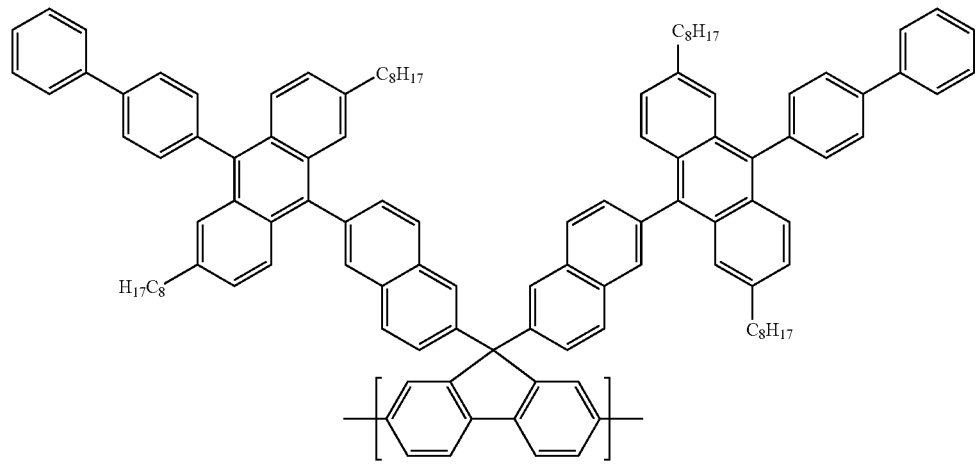
polymer 35
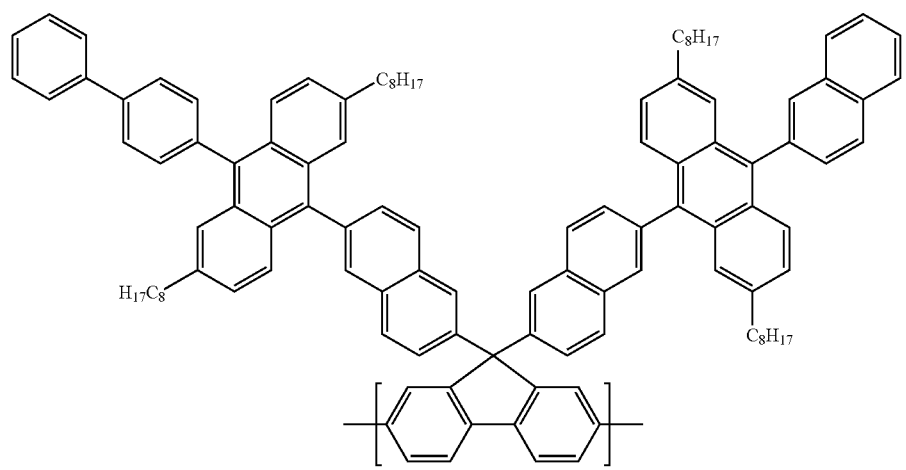
polymer 36
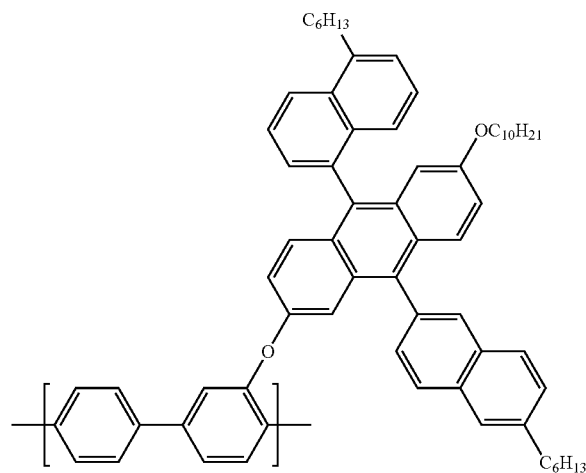
polymer 37

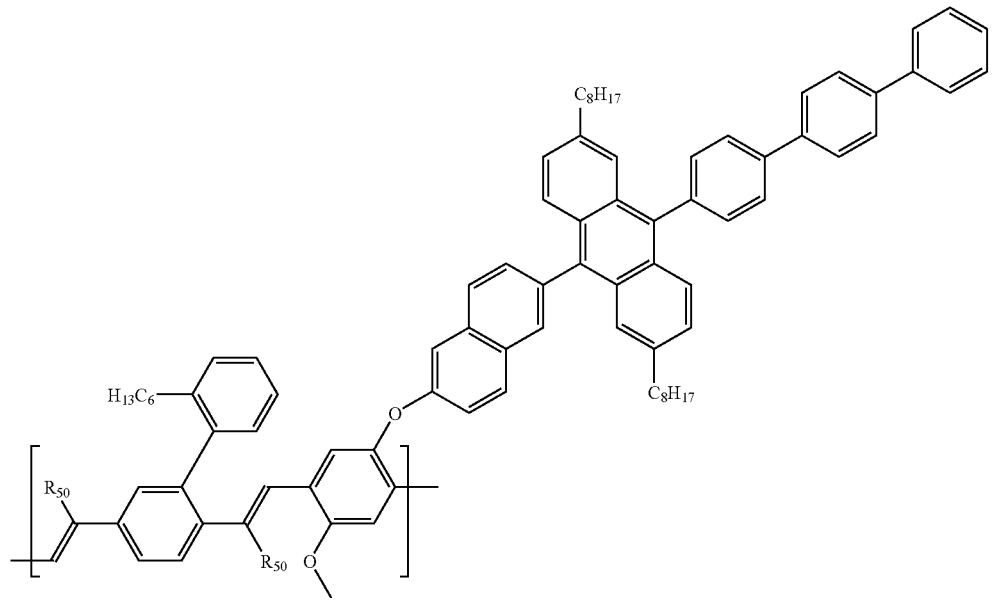
polymer 38 R₅₀ = H
polymer 39 R₅₀ = CN
polymer 40 R₅₀ = phenyl
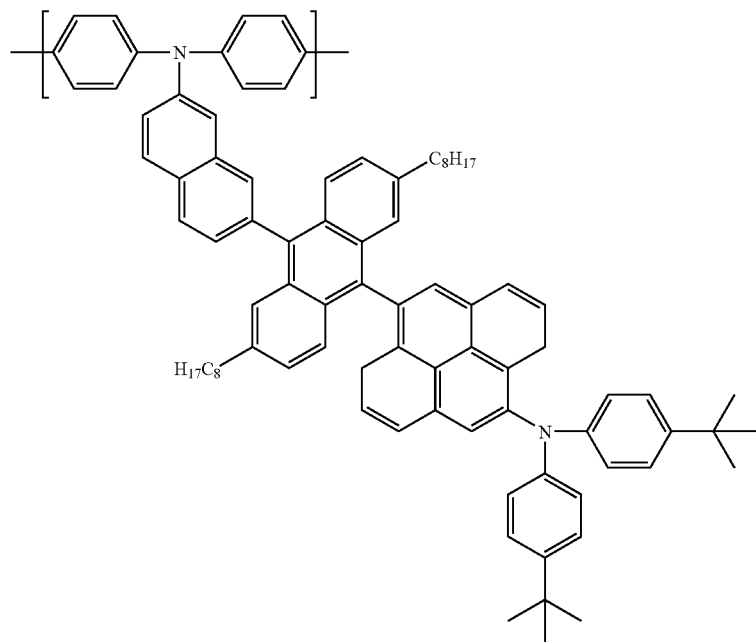
polymer 41

-continued
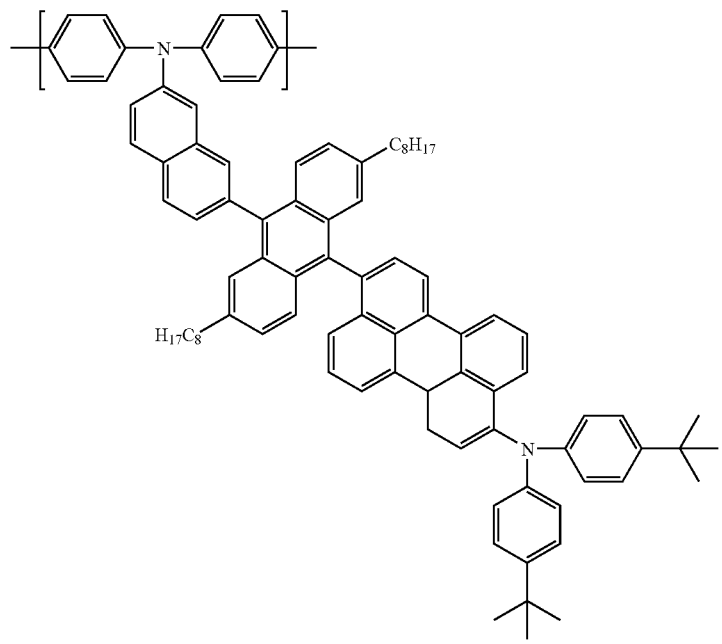
polymer 42
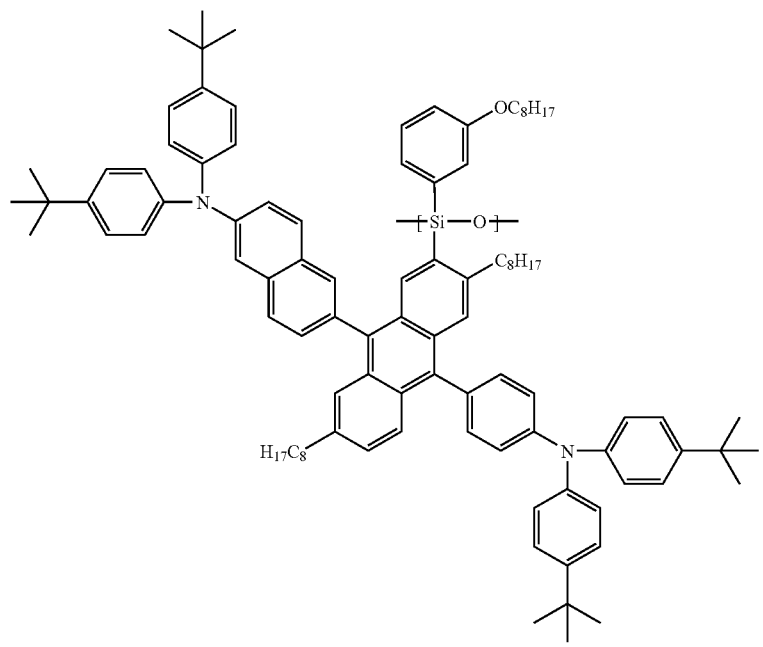
polymer 43

-continued
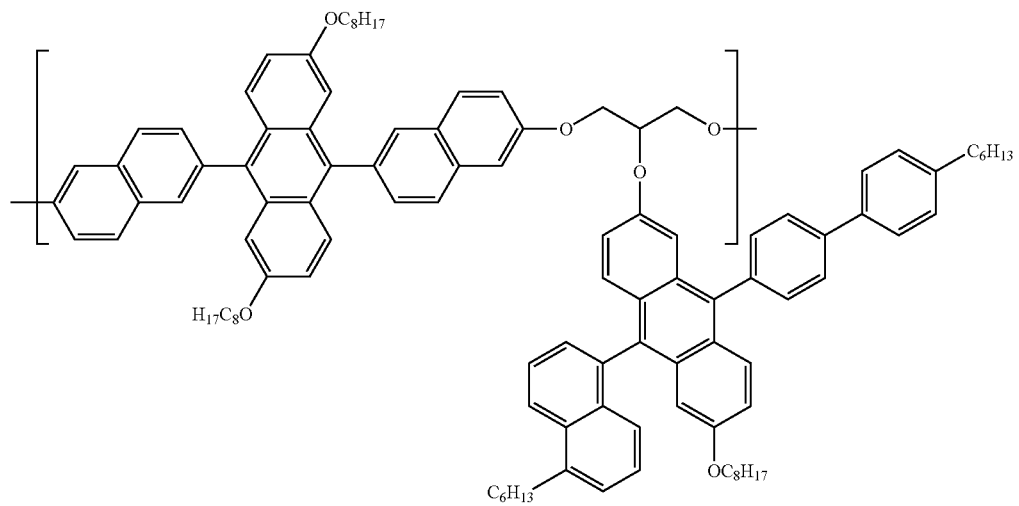
polymer 44
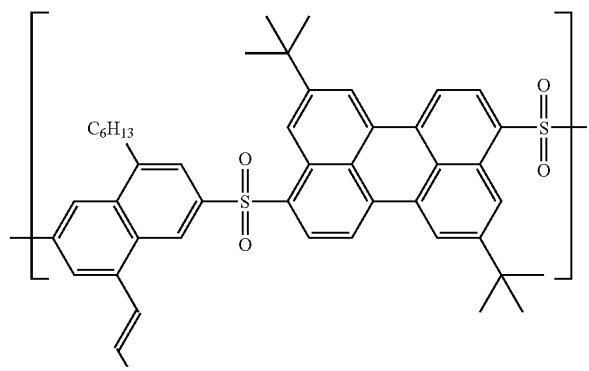
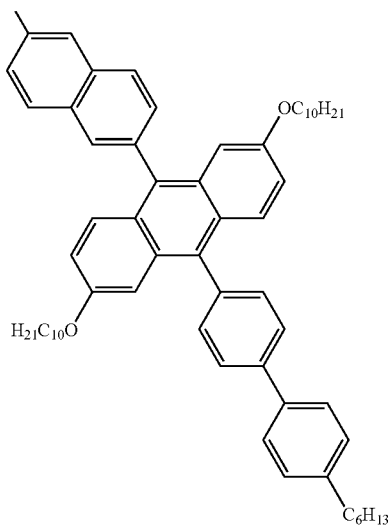
polymer 45

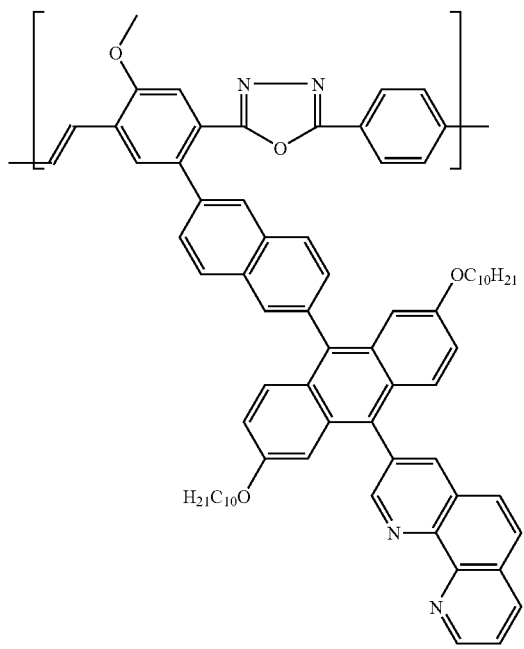
polymer 46
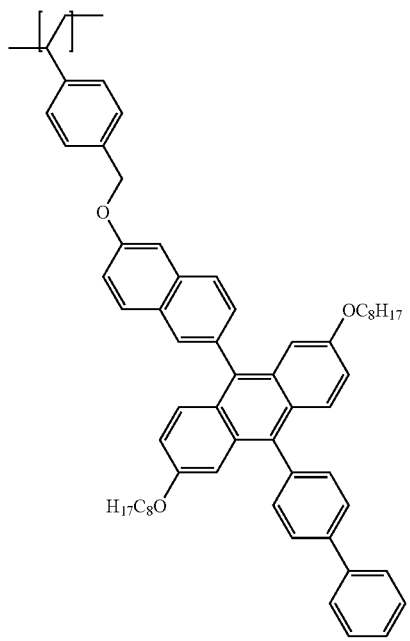
polymer 47

-continued
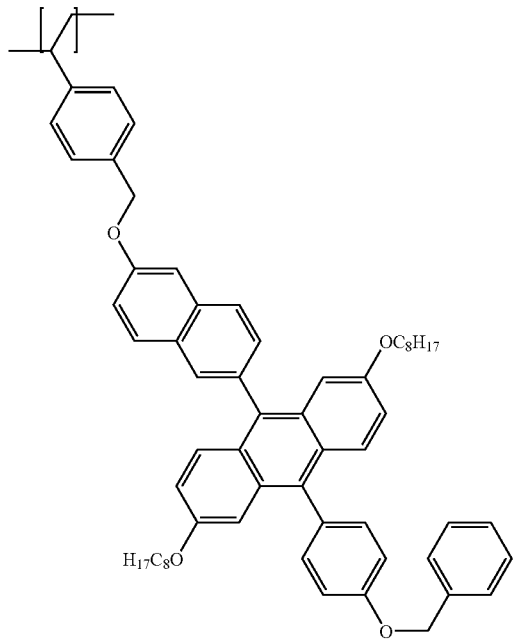
polymer 48
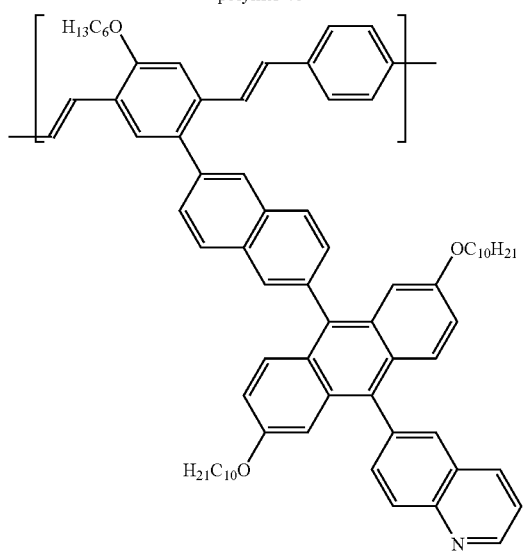
polymer 49
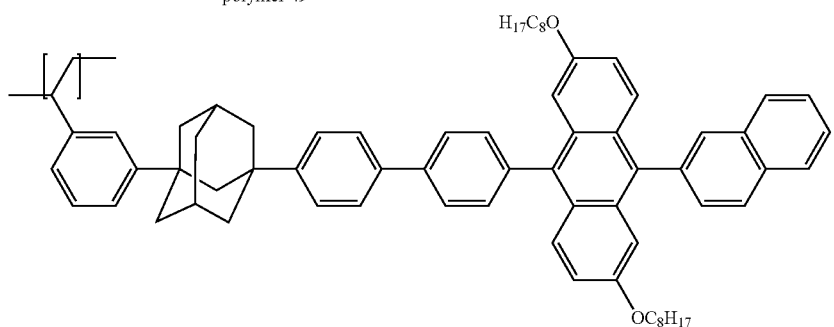
polymer 50

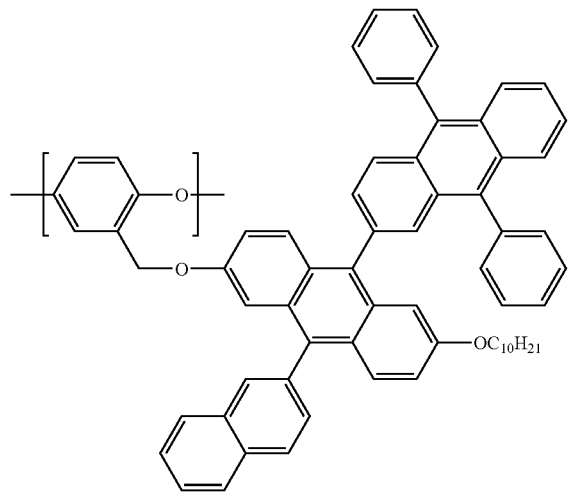
polymer 51
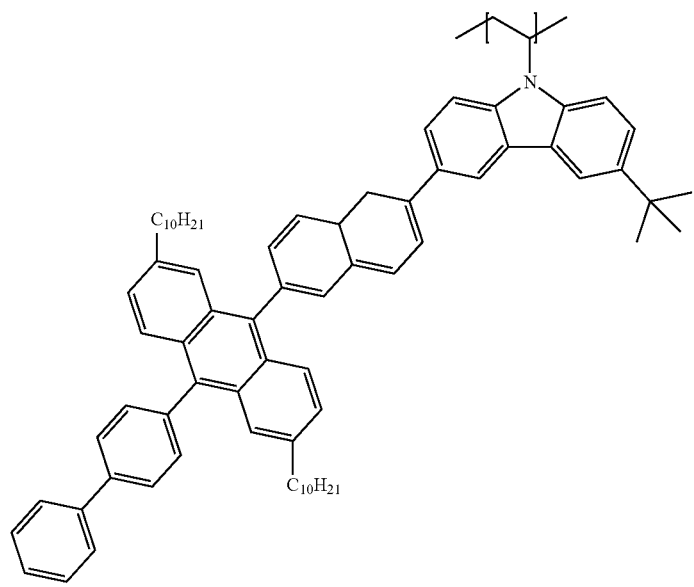
polymer 52
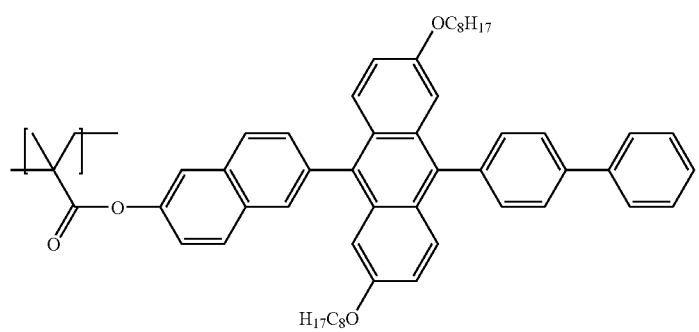
polymer 53

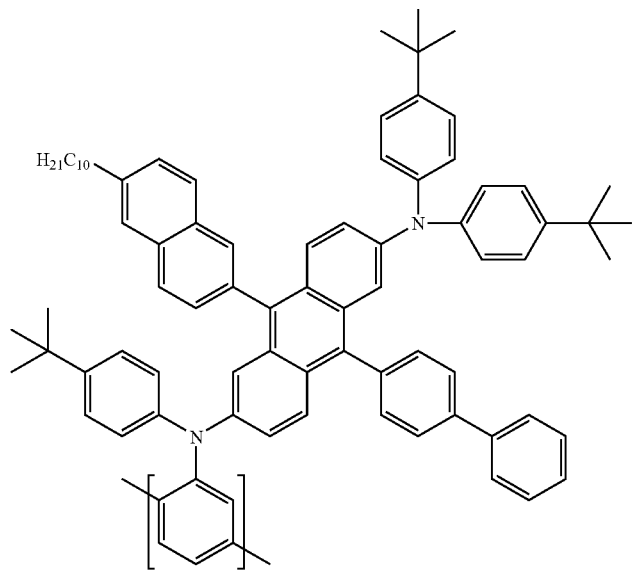
polymer 54
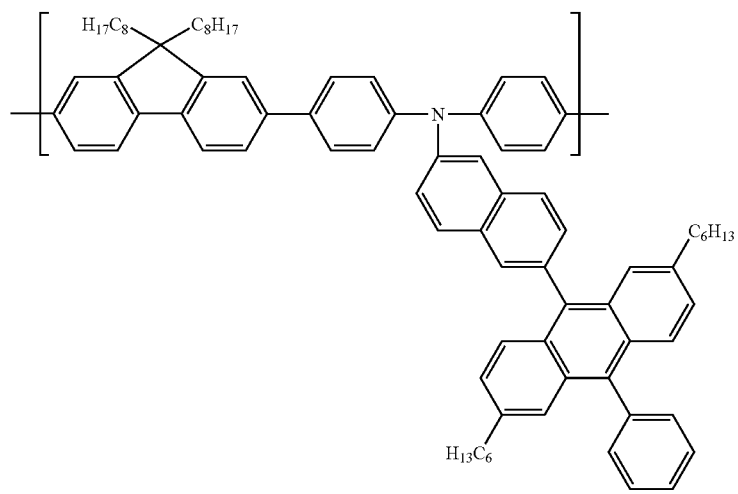
polymer 55

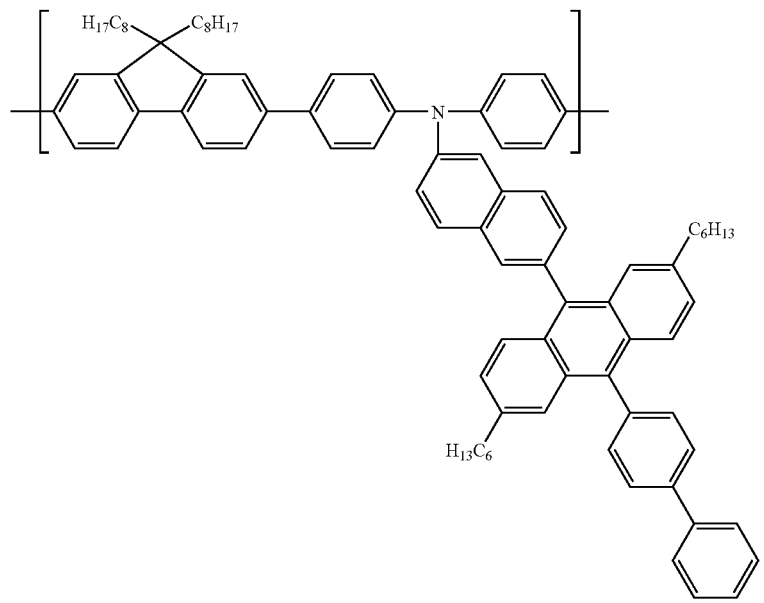
polymer 56
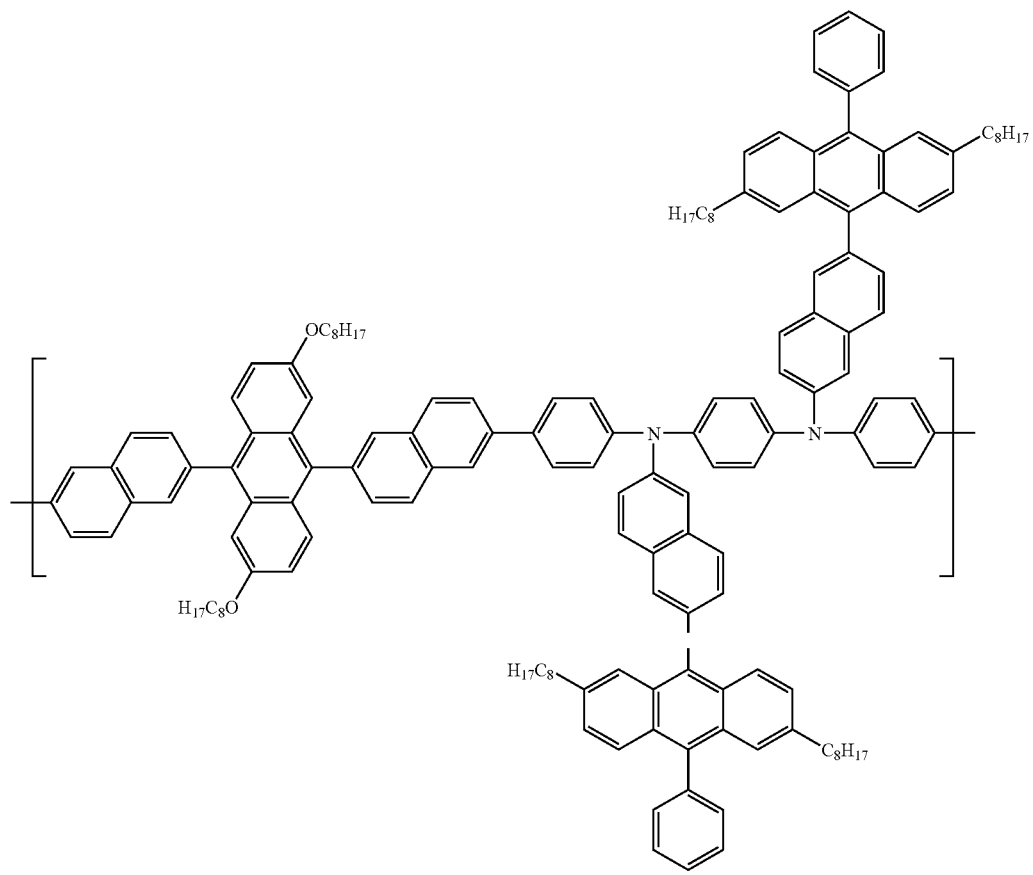
polymer 57

-continued
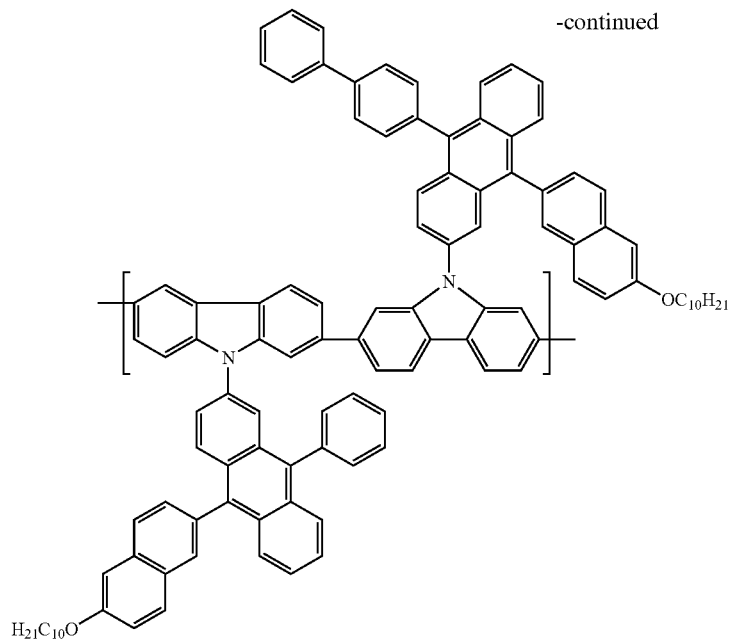
polymer 58
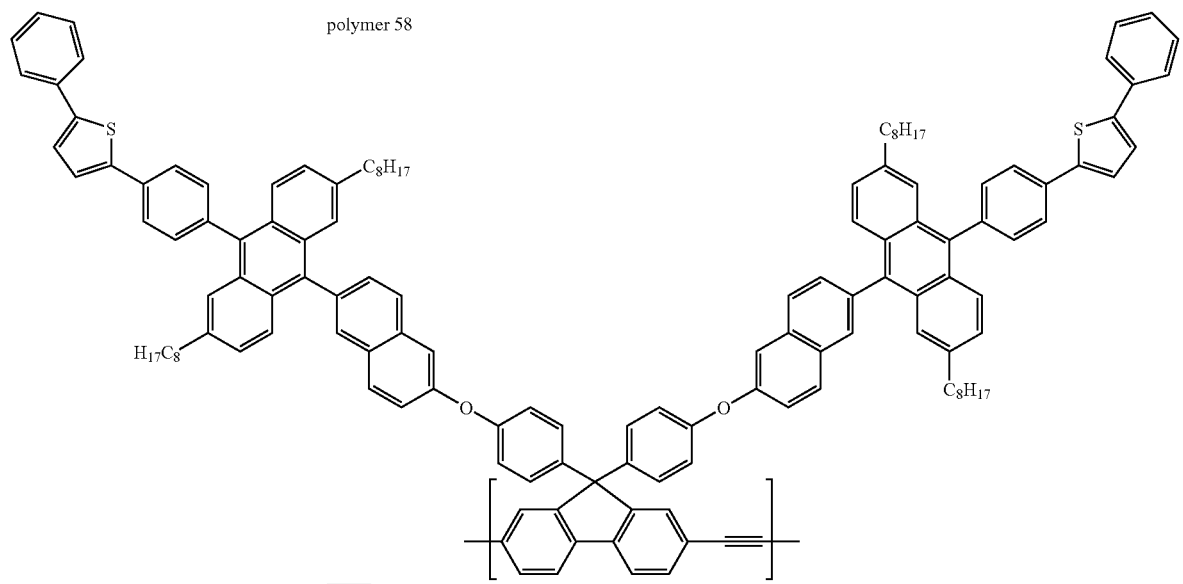
polymer 59
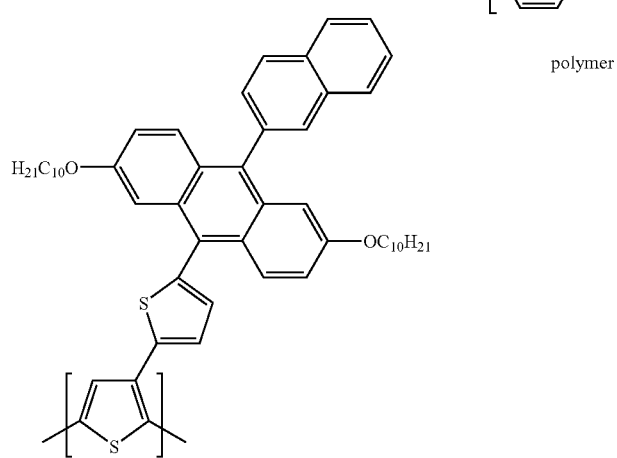
polymer 60

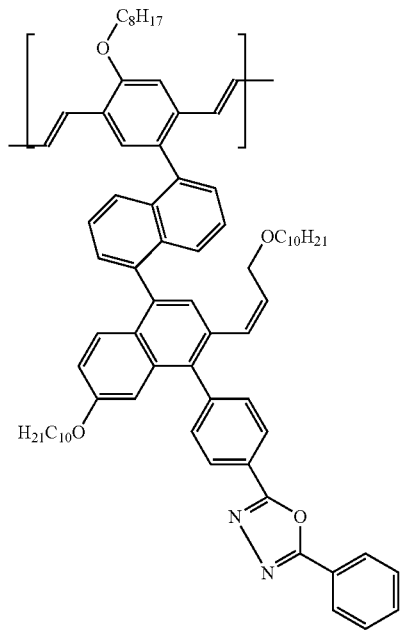

polymer 61

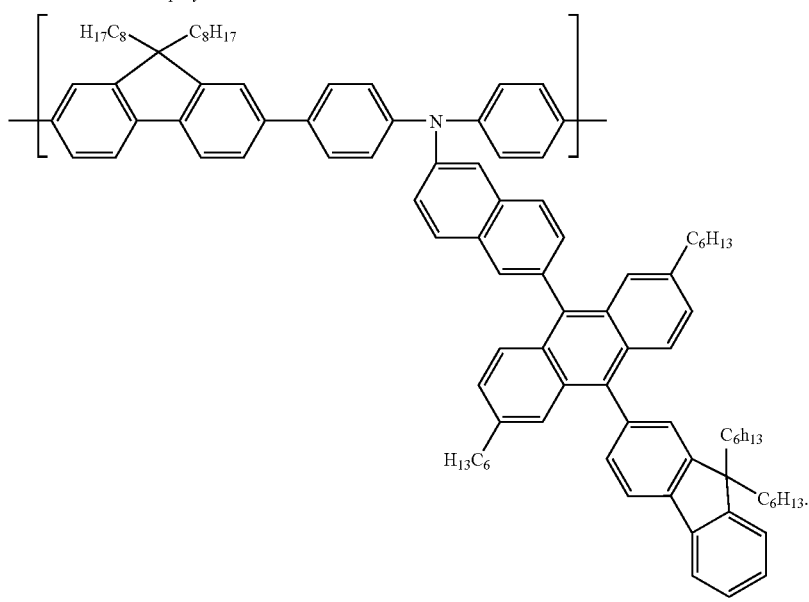

polymer 62

The specific molecular structures can be the combination of any of the above structures.

The polymers comprising naphthylanthracene moiety of repeating units of Formula described above can be synthesized using known methods. The polymerization method and the molecular weights of the resulting polymers used in the present invention are not necessary to be particularly restricted. The molecular weights of the polymers are at least 1000, and preferably at least 2000. The polymers can be prepared by condensation polymerizations, such as coupling reactions including Pd-catalyzed Suzuki coupling, Stille coupling, or Heck coupling, or Ni-mediated Yamamoto coupling, or Wittig reaction, or Horner-Emmons reaction, or Knoevenagel reaction, or dehalogenation of dibenzyl halides, or by other condensation methods to make the polyester, polyketone, polyamide, or polyester ketone, or ring opening polymerization, or free radical polymerization, or cationic polymerization or anionic polymerization. Preferably the polymers are prepared by free radical polymerization.

The synthetic scheme of the polymers according to the present invention is illustrated in Schemes 1 and 2.

The process of the invention provides polymers particularly useful for an optical device. The optical device can comprise a luminescent device such as an EL device in which the polymers of the present invention is deposited between a cathode and spaced-apart anode. The polymers can be deposited as thin film by vapor deposition method or thermal transfer, or from a solution by spin-coating, spray-coating, dip-coating, roller-coating, or ink jet delivery. The thin film can be supported by substrate directly, preferably a transparent substrate, or supported by the substrate indirectly where there is one or more inter layers between the substrate and thin film. The thin film can be used as emitting layer or charge carrier transporting layer.

General EL Device Architecture

The present invention can be employed in most organic EL device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 and is comprised of a substrate 101, an anode 103, a hole-injecting layer 105, a hole-transporting layer 107, a light-emitting layer 109, an electron-transporting layer 111, and a cathode 113. These layers are described in detail below. This figure is for illustration only and the individual layer thickness is not scaled according to the actual thickness. Note that the substrate can alternatively be located adjacent to the cathode, or the substrate can actually constitute the anode or cathode. The organic layers between the anode and cathode are conveniently referred to as the organic EL element.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the EL layers. It is still necessary that the substrate, at least in the emissive pixilated areas, be comprised of largely transparent materials such as glass or polymers. For applications where the EL emission is viewed through the top electrode, the transmissive characteristics of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate can be a complex structure comprising multiple layers of materials such as found in active matrix TFT designs. Of course it is necessary to provide in these device configurations a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. Anode can be modified with plasma-deposited fluorocarbons. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable way such as evaporation, sputtering, chemical vapor deposition, or electrochemical means. Anodes can be patterned using well known photolithographic processes. Optionally, anodes can be polished prior to application of other layers to reduce surface roughness so as to reduce shorts or enhance reflectivity.

Hole-Injection Layer (HIL)

Although not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenyl-amino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device in general contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

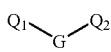

(A)

wherein:

Q$_1$ and Q$_2$ are independently selected aromatic tertiary amine moieties; and G is a linking group such as an arylene, cycloalkylene, or alkylene group of a carbon to carbon bond.

In one embodiment, at least one of Q$_1$ or Q$_2$ contains a polycyclic fused ring structure, e.g. a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B):

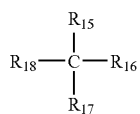

(B)

wherein:

R$_{15}$ and R$_{16}$ each independently represents a hydrogen atom, an aryl group, or an alkyl group or R$_{15}$ and R$_{16}$ together represent the atoms completing a cycloalkyl group; and R$_{17}$ and R$_{18}$ each independently represents an aryl group, which is in turn substituted with a diaryl substituted amino group, as indicated by structural Formula (C):

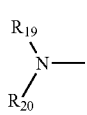

(C)

wherein R$_{19}$ and R$_{20}$ are independently selected aryl groups.

In one embodiment, at least one of R$_{19}$ or R$_{20}$ contains a polycyclic fused ring structure, e.g., a naphthalene.

Another class of aromatic tertiary amines is the tetraaryldiamines. Desirable tetraaryldiamines include two diarylamino groups, such as indicated by Formula (C), linked through an arylene group. Useful tetraaryldiamines include those represented by Formula (D):

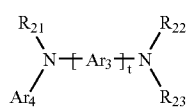

(D)

wherein each Ar$_3$ is an independently selected arylene group, such as a phenylene or anthracene moiety;

t is an integer of from 1 to 4; and

Ar$_4$, R$_{21}$, R$_{22}$, and R$_{23}$ are independently selected aryl groups. In a typical embodiment, at least one of Ar$_4$, R$_{21}$, R$_{22}$, and R$_{23}$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The hole-transporting layer can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
4,4'-Bis(diphenylamino)quadriphenyl;
Bis(4-dimethylamino-2-methylphenyl)-phenylmethane;
N,N,N-Tri(p-tolyl)amine;
4-(di-p-tolylamino)-4'-[4(di-p-tolylamino)-styryl]stilbene;
N,N,N',N'-Tetra-p-tolyl-4-4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl;
4,4'-Bis[N-(1-naphthyl)-N-(2-naphthyl)amino]biphenyl;
4,4"-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amine]fluorene;
1,5-Bis[N-(1-naphthyl)-N-phenylamino]naphthalene; and
4,4',4"-tris[(3-methylphenyl)phenylamino]triphenylamine.

Another class of useful hole-transporting materials includes polycyclic aromatic compounds as described in EP 1 009 041 A2. Tertiary aromatic amines with more than two amine groups can be used including oligomeric materials. In addition, polymeric hole-transporting/hole injection materials can be used such as poly(N-vinylcarbazole) (PVK), polythiophenes, polypyrrole, polyaniline (Yang, Y. et al. *Appl. Phys. Lett.* 1994, 64, 1245) and copolymers such as poly(3,4-ethylenedioxythiophene)/poly(4-styrenesulfonate) also called PEDOT/PSS (Groenendaal, L. B. et al. *Adv. Mater.* 2000, 12, 481).

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material including both small molecules and polymers. For small molecules, more commonly the LEL includes a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is typically chosen from highly fluorescent dyes, but phosphorescent compounds, e.g., transition metal complexes as described in WO 98/55561, WO 00/18851, WO 00/57676, and WO 00/70655 are also useful. Simultaneously, the color of the EL devices can be tuned using dopants of different emission wavelengths. By using a mixture of dopants, EL color characteristics of the combined spectra of the individual dopant are produced. This dopant scheme has been described in considerable detail for EL devices in U.S. Pat. No. 4,769,292 for fluorescent dyes. Dopants are typically coated as 0.01 to 10% by weight into the host material. Polymeric materials such as polyfluorenes and poly(arylene vinylenes), e.g. poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the band gap potential which is defined as the energy difference between the highest occupied molecular orbital (HOMO) and the lowest unoccupied molecular orbital (LUMO) of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

For small molecules, host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

For example, small molecule metal complexes of 8-hydroxyquinoline and similar derivatives (Formula E) constitute one class of useful host compounds capable of supporting electroluminescence, and are particularly suitable for light emission of wavelengths longer than 500 nm, e.g. green, yellow, orange, and red

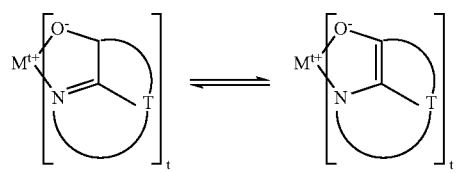

(E)

wherein:

M represents a metal;

t is an integer of from 1 to 4; and

T independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

T completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:

CO-1: Aluminum trisoxine [alias, tris(8-quinolinolato)aluminum(III)];

CO-2: Magnesium bisoxine [alias, bis(8-quinolinolato)magnesium(II)];

CO-3: Bis[benzo {f}-8-quinolinolato]zinc (II);

CO-4: Bis(2-methyl-8-quinolinolato)aluminum(III)-μ-oxo-bis(2-methyl-8-quinolinolato) aluminum(III);

CO-5: Indium trisoxine [alias, tris(8-quinolinolato)indium];

CO-6: Aluminum tris(5-methyloxine) [alias, tris(5-methyl-8-quinolinolato) aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Derivatives of 9,10-dinaphthylanthracene (Formula F) constitute one class of useful hosts capable of supporting electroluminescence, and are particularly suitable for light emission of wavelengths longer than 400 nm, e.g. blue, green, yellow, orange or red

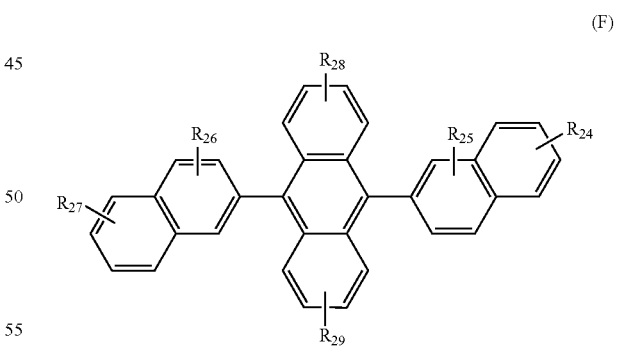

(F)

wherein:

$R_{24}$, $R_{25}$, $R_{26}$, $R_{27}$, $R_{28}$, and $R_{29}$ represent one or more substituents on each ring where each substituent is individually selected from the following groups:

Group 1: hydrogen, or alkyl of from 1 to 24 carbon atoms;

Group 2: aryl of from 6 to 20 carbon atoms, or heteroaryl of from 5 to 20 carbon atoms;

Group 3: carbon atoms from 4 to 24 necessary to complete a fused aromatic ring of anthracenyl; pyrenyl, or perylenyl;

Group 4: heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Distyrylarylene derivatives are also useful hosts, as described in U.S. Pat. No. 5,121,029. Carbazole derivatives are particularly useful hosts for phosphorescent emitters.

Useful fluorescent dopants (FD) include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Useful phosphorescent dopants (PD) include but are not limited to organometallic complexes of transition metals of iridium, platinum, palladium, or osmium. Illustrative examples of useful dopants include, but are not limited to, the following:

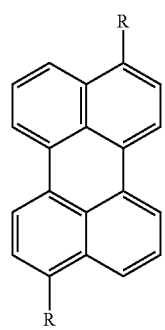

FD 1 R = H
FD 2 R = $CO_2Pr$-i

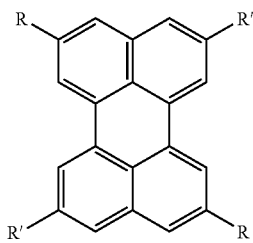

FD 3 R = H, R' = t-Bu
FD 4 R = R' = t-Bu

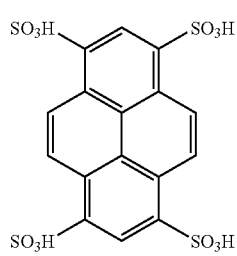

FD 5

-continued

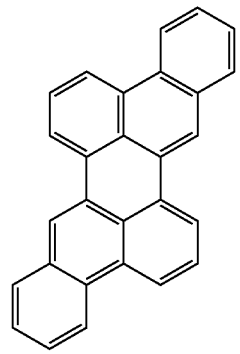

FD 6

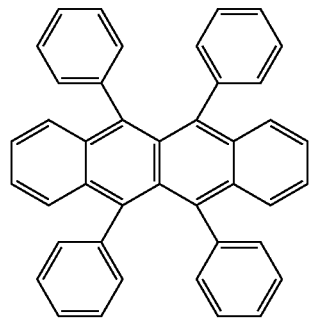

FD 7

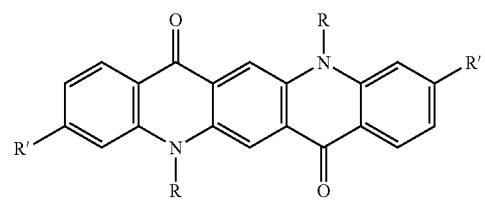

FD 8 R = R' = H
FD 9 R = Me, R' = H
FD 10 R = Pr-i, R' = H
FD 11 R = Me, R' = F
FD 12 R = phenyl, R' = H

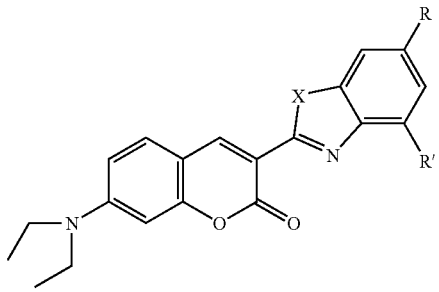

FD 13 R = R' = H, X = O
FD 14 R = H, R' = Me, X = O
FD 15 R = Me, R' = H, X = O
FD 16 R = Me, R' = Me, X = O
FD 17 R = H, R' = t-Bu, X=O
FD 18 R = t-Bu, R' = H, X = O
FD 19 R = R' = t-Bu, X = O
FD 20 R = R' = H, X = S
FD 21 R = H, R' = Me, X = S
FD 22 R = Me, R' = H, X=S
FD 23 R = Me, R' = Me, X = S
FD 24 R = H, R' = t-Bu, X = S
FD 25 R = t-Bu, R' = H, X = S
FD 26 R = R' = t-Bu, X = S

-continued
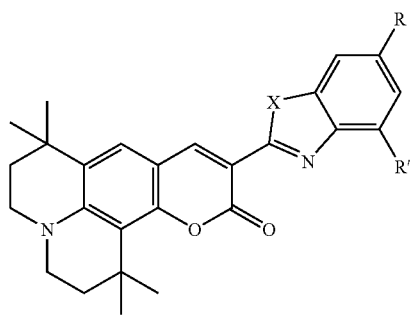
FD 27 R = R' = H, X = O
FD 28 R = H, R' = Me, X = O
FD 29 R = Me, R' = H, X = O
FD 30 R = Me, R' = Me, X = O
FD 31 R = H, R' = t-Bu, X=O
FD 32 R = t-Bu, R' = H, X = O
FD 33 R = R' = t-Bu, X = O
FD 34 R = R' = H, X = S
FD 35 R = H, R' = Me, X = S
FD 36 R = Me, R' = H, X=S
FD 37 R = Me, R' = Me, X = S
FD 38 R = H, R' = t-Bu, X = S
FD 39 R = t-Bu, R' = H, X = S
FD 40 R = R' = t-Bu, X = S
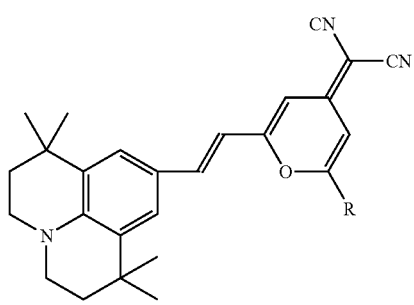
FD 41 R = phenyl
FD 42 R = Me
FD 43 R = t-Bu
FD 44 R = mesityl
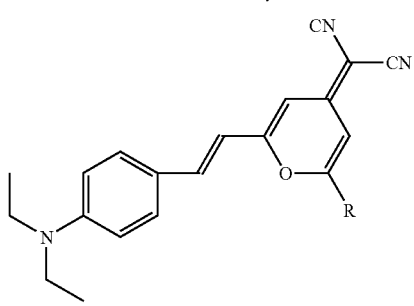
FD 45 R = phenyl
FD 46 R = Me
FD 47 R = t-Bu
FD 48 R = mesityl
FD 49
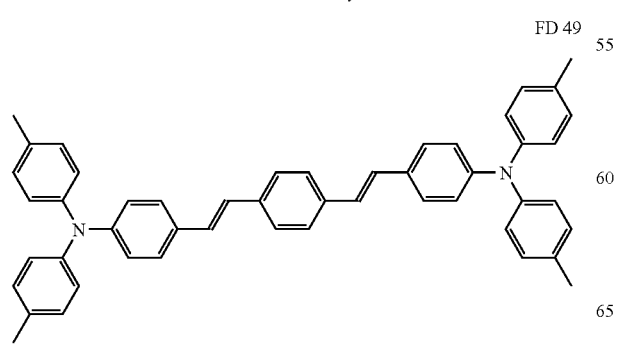
-continued
FD 50
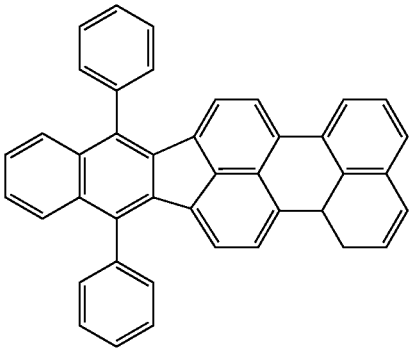
FD 51
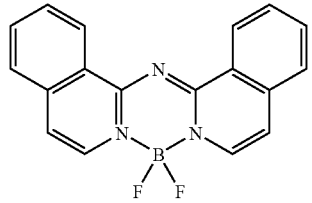
FD 52
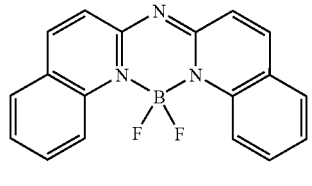
FD 53
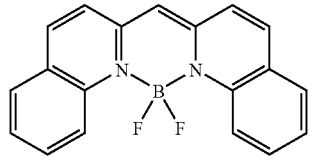
PD 1 (Ir(PPY)$_3$)
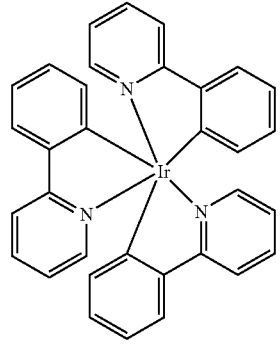
PD 2
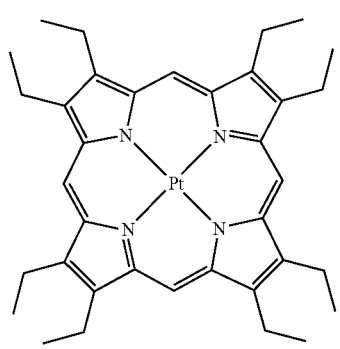

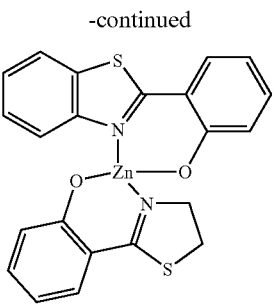

PD 3

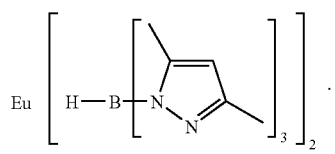

PD 4

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Triazines are also known to be useful as electron transporting materials. Oxadiazole compounds including small molecules and polymers are useful electron transporting materials as described in U.S. Pat. No. 6,451,457.

Cathode

When light emission is viewed solely through the anode, the cathode 113 used in this invention can be comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or includes these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368 A2. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation, or layers 107 and 109 can optionally be collapsed into a single layer that serves the function of supporting both light emission and hole transportation. Alternatively, layers 107, 109 and 111 can optionally be collapsed into a single layer that serves the function of supporting both light emission and hole and electron transportation. This is the preferred EL device structure of this invention and is referred to as "single-layer" device.

It also known in the art that emitting dopants can be added to the hole-transporting layer, which can serve as a host. Multiple dopants can be added to one or more layers in order to produce a white-emitting EL device, for example, by combining blue- and yellow-emitting materials, cyan- and red-emitting materials, or red-, green-, and blue-emitting materials. White-emitting devices are described, for example, in EP 1 187 235 A2, EP 1 182 244 A1, U.S. Patent Application Publication 2002/0025419 A1, and U.S. Pat. Nos. 5,683,823, 5,503,910, 5,405,709, and 5,283,182.

Additional layers such as electron or hole-blocking layers as taught in the art can be employed in devices of this invention. Hole-blocking layers are commonly used to improve efficiency of phosphorescent emitter devices, for example, as in U.S. Patent Application Publication 2002/0015859 A1.

This invention can be used in so-called stacked device architecture, for example, as taught in U.S. Pat. Nos. 5,703,436 and 6,337,492.

Deposition of Organic Layers

The organic materials mentioned above can be deposited as high quality transparent thin films by various methods such as a vapor deposition or sublimation method, an electron-beam method, a sputtering method, a thermal transferring method, a molecular lamination method and a coating method such as solution casting, spin-coating or inkjet printing, with an optional binder to improve film formation. If the material is a polymer, solvent deposition is typically preferred. The material to be deposited by sublimation can be vaporized from a sublimator "boat" often comprised of a tantalum material, e.g. as described in U.S. Pat. No. 6,237,529, or can be first coated onto a donor sheet and then sublimed in closer proximity to the substrate. Layers with a mixture of materials can use separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Preferably, the spin-coating or inkjet printing technique is used to deposit the polymer of the invention, and only one polymer is deposited in a single layer device.

Encapsulation

Most organic EL devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

Organic EL devices of this invention can employ various well known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

EXAMPLES

The invention and its advantages are further illustrated by the following specific Examples.

Synthesis of Monomers

The monomers to be used in the present invention to construct polymers are not necessary to be particularly restricted. Any monomers can be used as long as the polymer formed is a polymer that satisfies the general Formulas (I). Typical synthesis is illustrated in Schemes 1 and 2.

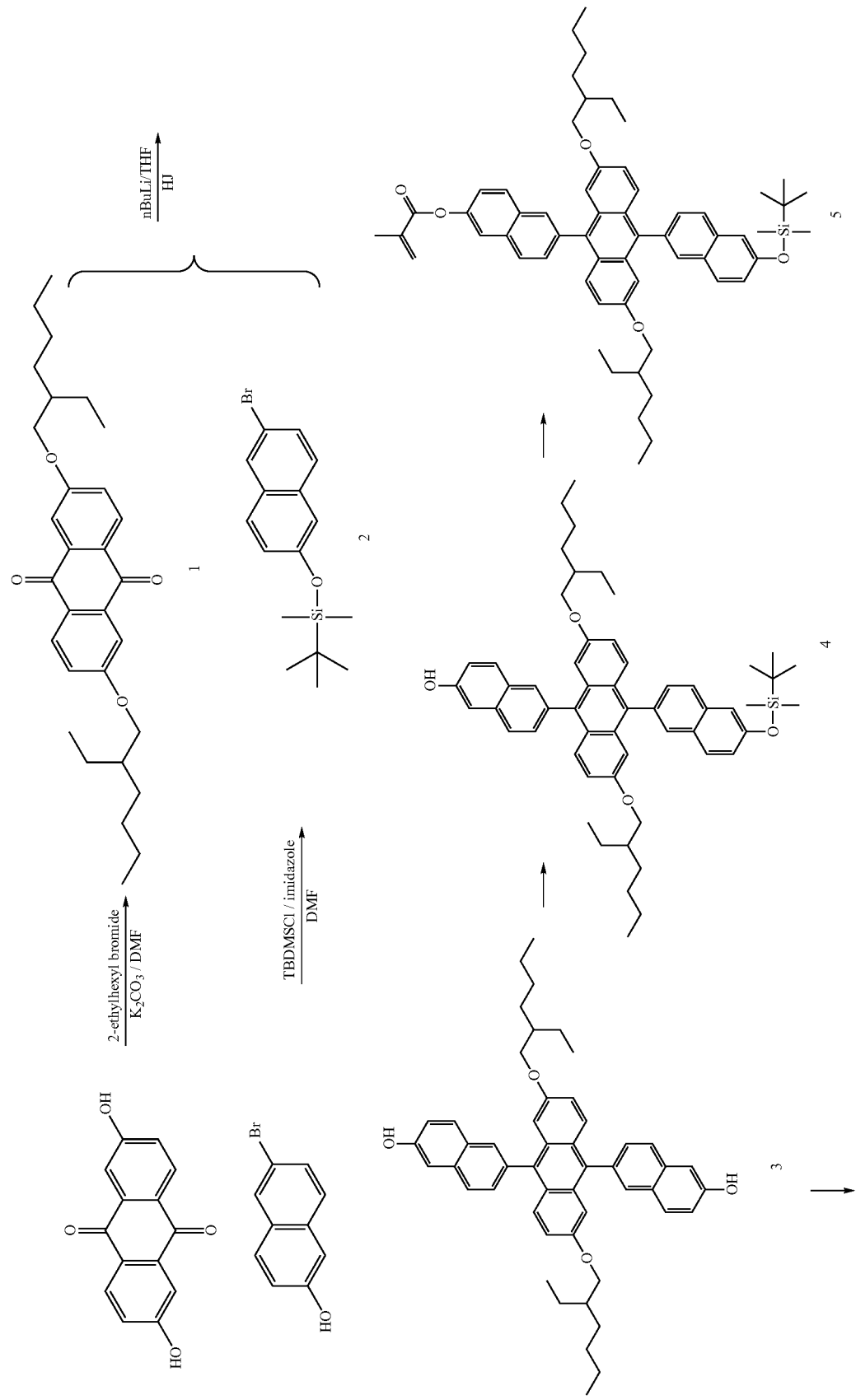

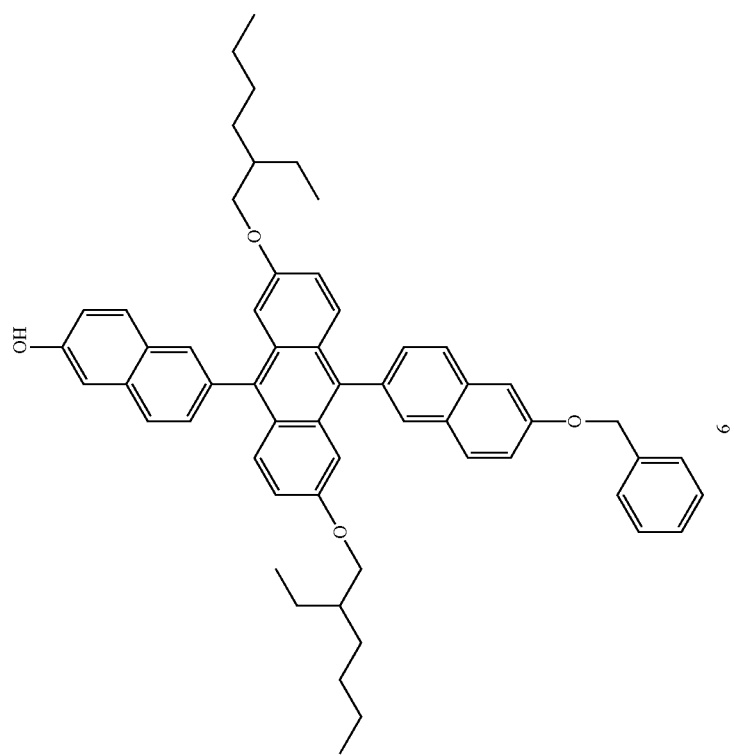
6
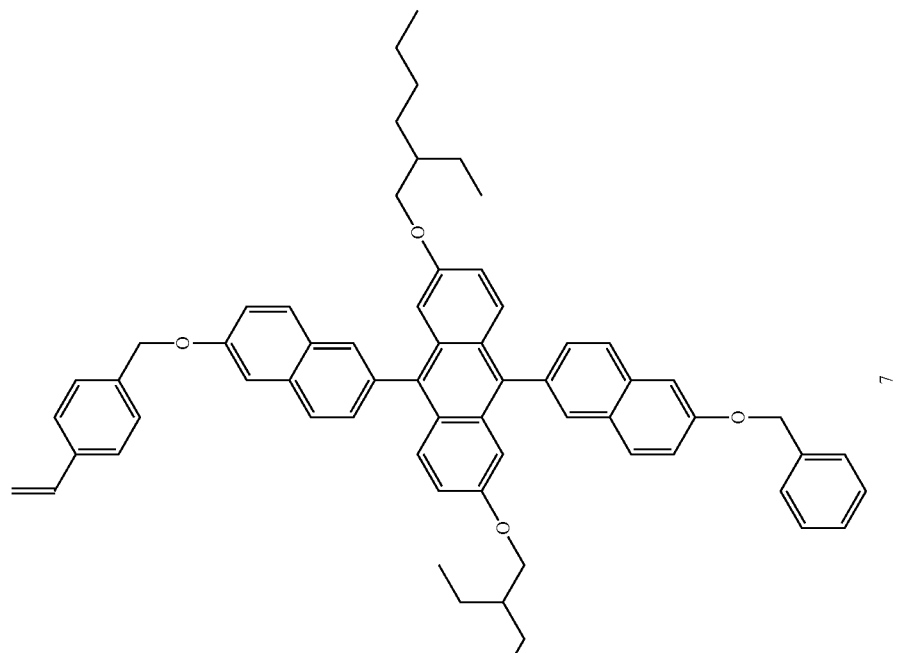
7

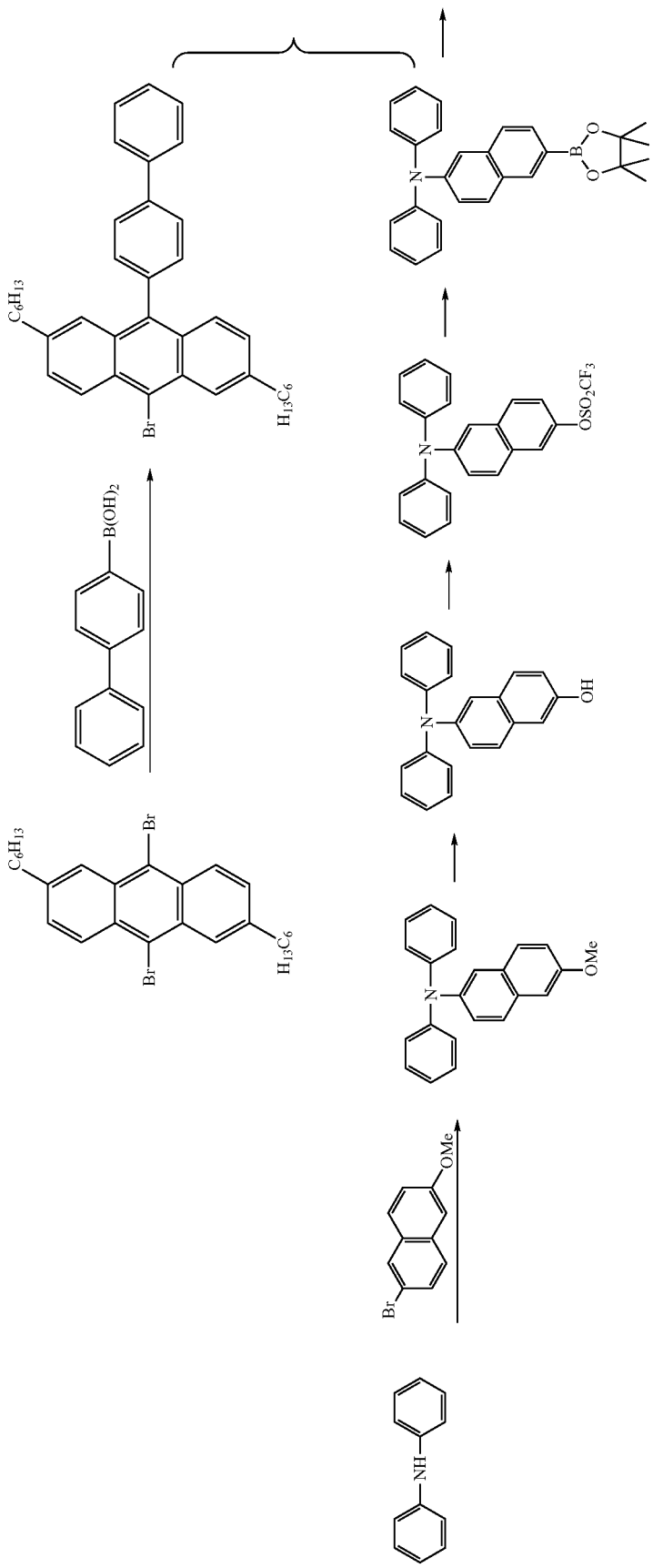

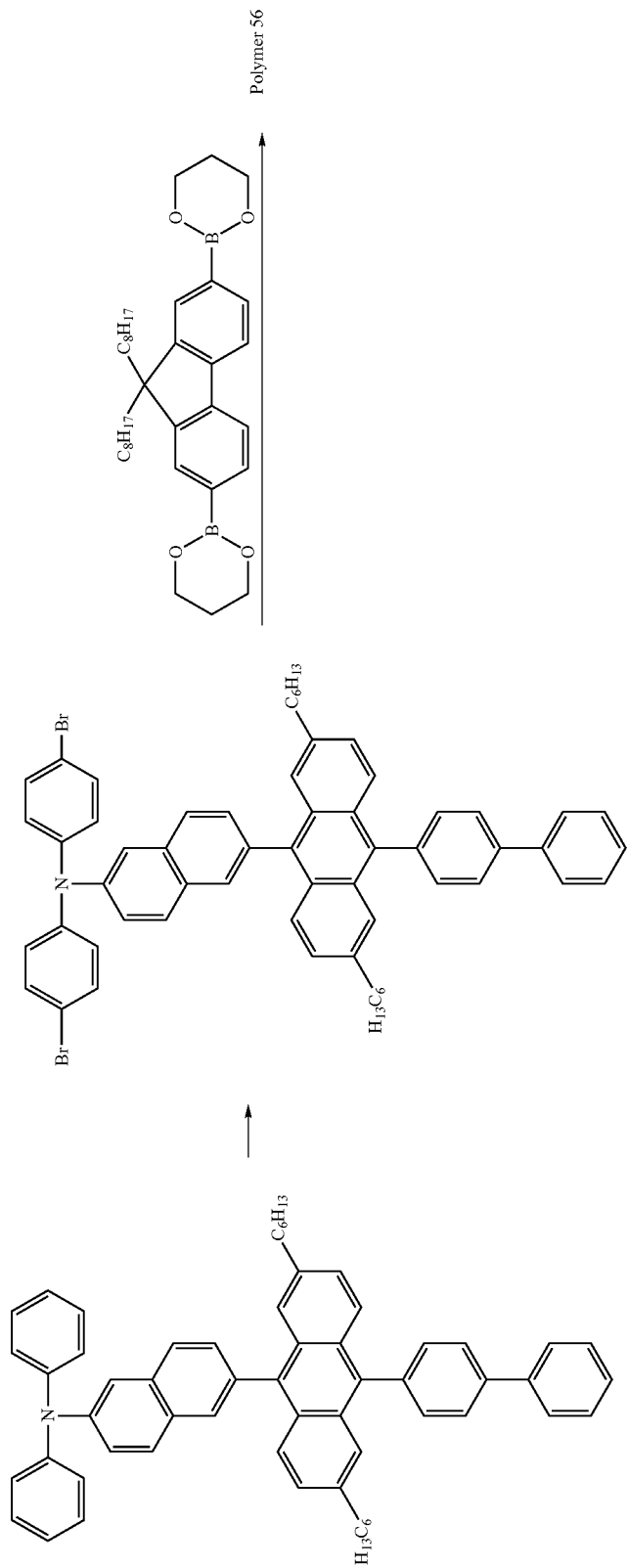

Example 1

Synthesis of 2,6-di(2-ethylhexyloxy)anthraquinone (Compound 1)

2,6-Dihydroxyanthraquinone (100.0 g, 0.42 mol) and 2-ethylhexyl bromide (165.0 g, 0.86 mol) were dissolved in 1 L of DMF. To this solution was added anhydrous $K_2CO_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over $MgSO_4$. Solvent was removed and the crude product was recrystallized from methanol to give yellow powdery product 125.21 g (65% yield). $^1$H NMR (CDCl$_3$) δ (Ppm): 0.92-0.98 (m, 12H, CH$_3$), 1.34-1.54 (m, 16H), 1.75-1.81 (m, 2H, CH(CH$_3$)), 4.02 (d, J=5.5 Hz, 4H, OCH$_2$), 7.19 (d, J=8.4 Hz, 2H), 7.70 (s, 2H), 8.19 (d, J=8.5 Hz, 2H); $^{13}$C NMR (CDCl$_3$): 11.12, 14.06, 23.04, 23.88, 29.08, 30.51, 39.34, 71.34, 110.64, 120.84, 127.00, 129.62, 135.88, 164.29, 182.27. M.p. 49-51° C.; FD-MS: m/z 464 (M$^+$).

Example 2

Synthesis of 2-bromo-6-t-butyldimethylsiloxynaphthalene (Compound 2)

2-Bromo-6-hydroxynaphthalene (100.0 g, 0.45 mol) and imidazole (75.0 g, 1.10 mol) were dissolved in 300 mL of DMF. To this solution was added TBDMS-Cl (80.0 g, 0.53 mol). The reaction was stirred at room temperature under nitrogen overnight. The reaction was poured into water, and the precipitate was filtered, washed with water and cold ethanol. The crude product was recrystallized from ethanol to give 97.2 g of off-white crystals (64% yield). $^1$H NMR (CDCl$_3$) δ ppm: 0.24 (s, 6H), 1.01 (s, 9H), 7.07 (dd, J$_1$=8.8 Hz, J$_2$=2.3 Hz, 1H), 7.14 (s, 1H), 7.45 (dd, J$_1$=8.8 Hz, J$_2$=2.3 Hz, 1H), 7.53 (d, J=8.8 Hz, 1H), 7.60 (d, J=8.8 Hz, 1H), 7.90 (s, 1H). $^{13}$C NMR (CDCl$_3$) δ ppm: −4.34, 18.24, 25.68, 114.86, 117.26, 123.05, 128.29, 128.42, 129.39, 129.57, 130.24, 133.04. Mp 62-64° C. FD-MS: 337 (M$^+$).

Example 3

Synthesis of 2,6-bis(2-ethylhexyloxy)-9,10-bis(2-(6-hydroxy-naphthyl))anthracene (Compound 3)

Compound 2 (47.0 g, 0.14 mol) was dissolved in 130 mL of anhydrous THF and the solution was cooled to −78° C. To this solution slowly was added nBuLi (2.5 M in hexane, 55.5 mL, 0.14 mol) to maintain the temperature lower than −60° C. After the addition, the reaction was stirred at −78° C. for 1 h. Compound 1 (25.0 g, 0.048 mol) was dissolved in 120 mL of dry THF and added dropwise to the above reaction. After 3 h, TLC indicated the completion of the reaction. The reaction was quenched with HI aqueous solution (47% in water, 85 mL, 1.4 mol) and heated to reflux for 1 h. The reaction was extracted with methylene chloride, and the combined organic phase was washed with saturated sodium meta bisulfite solution and dried over $MgSO_4$. The crude product as a brownish oil/solid was purified by column on silica gel and then recrystallized from CH$_3$CN to give 25.5 g pure product as light greenish yellow solid (67% yield). $^1$H NMR (CDCl$_3$) δ (ppm): 0.73-0.84 (m, 12H, CH$_3$), 1.16-1.35 (m, 16H, alkyl), 1.54-1.60 (m, 2H, CH(CH$_2$CH$_3$)), 3.66 (d, J=5.5 Hz, 4H, OCH$_2$), 6.90 (d, J=2.3 Hz, 2H), 6.98 (dd, J$_1$=9.5 Hz, J$_2$=2.5 Hz, 2H), 7.21 (dd, J$_1$=8.8 Hz, J$_2$=2.4 Hz, 2H), 7.33 (d, J=2.3 Hz, 2H), 7.56 (d, J=9.4 Hz, 2H), 7.84 (d, J=8.8 Hz, 2H), 7.90 (s, 2H), 7.91 (d, J=8.8 Hz, 2H); $^{13}$C NMR (CDCl$_3$) δ (ppm): 11.07, 14.00, 22.94, 23.78, 28.98, 30.51, 39.00, 70.09, 103.96, 109.54, 118.09, 120.11, 126.55, 127.22, 128.27, 129.08, 129.79, 129.99, 130.08, 130.24, 133.86, 134.71, 134.93, 153.60, 155.69; Mp 174-176° C.; FD-MS: 718 (M$^+$).

Example 4

Synthesis of 2,6-bis(2-ethylhexyloxy)-9-(2-(6-t-butyldimethylsiloxy-naphthyl))-10-(2-(6-hydroxynaphthyl))anthracene (Compound 4)

Compound 3 (3.0 g, 4.2 mmol) and imidazole (0.6 g, 8. mmol) were dissolved in 15 mL of DMF. To this solution was added TBDMS-Cl (0.99 g, 6.6 mmol). The reaction was stirred at room temperature under nitrogen overnight. The reaction was poured into water, extracted with methylene chloride and the combined organic phase was dried over $MgSO_4$. The crude product was purified by column chromatography on silica gel using hexane/methylene chloride (15/85) as an eluent to give 1.79 g pure product as greenish yellow solid (51% yield). $^1$H NMR (CDCl$_3$) δ (ppm):0.33 (s, 6H), 0.75-0.84 (m, 12H), 1.08 (s, H), 1.16-1.34 (m, 18H), 3.66 (d, J=5.3 Hz, 4H), 6.89-6.91 (m, 2H), 6.98 (dd, J$_1$=9.5 Hz, J$_2$=2.4 Hz, 2H), 7.16-7.22 (m, 2H), 7.34 (dd, J$_1$=9.5 Hz, J$_2$=2.4 Hz, H), 7.54-7.60 (m, 4H), 7.79 7.93 (m, 6H). $^{13}$C NMR (CDCl$_3$) δ (ppm): −4.243, 11.07, 14.01, 22.94, 23.78, 25.76, 28.98, 30.52, 39.00, 70.07, 70.13, 103.96, 104.03, 109.50, 114.84, 118.19, 120.09, 122.40, 126.53, 126.82, 127.23, 128.28, 128.33, 128.99, 129.37, 129.52, 129.81, 129.88, 129.99, 130.18, 133.91, 134.61, 134.80, 134.94, 135.04, 153.75, 153.82, 155.68. Mp 125-127° C. FD-MS: 832 (M$^+$).

Example 5

Synthesis of 2,6-bis(2-ethylhexyloxy)-9-(2-(6-t-butyldimethyl-siloxynaphthyl))-10-(2-(6-methacryloylnaphthyl))anthracene (Compound 5)

Compound 4 (2.44 g, 2.9 mmol) was dissolved in 30 mL of methylene chloride and triethylamine (0.36 g, 3.5 mmol) was added. The solution was cooled to 0° C. and methacryloyl chloride (0.37 g, 3.5 mmol) was added. The reaction was stirred at room temperature under nitrogen overnight. The reaction was washed with water and the organic phase was dried over $MgSO_4$. The crude product was purified by column chromatography on silica gel using hexane/ethyl acetate (98/2) as an eluent to give 2.01 g pure product as bright yellow solid (76% yield). $^1$H NMR (CDCl$_3$) δ (ppm): 0.33 (s, 6H), 0.75-0.85 (m, 12H), 1.08 (s, 9H), 1.18-1.38 (m, 18H), 2.16 (s, 3H), 3.64-3.67 (m, 4H), 5.84-5.85 (m, 1H, vinyl), 6.47 (s, 1H, vinyl), 6.85 (d, J=1.9 Hz, 1H), 6.92 (s, 1H), 6.97-7.01 (m, 2H), 7.16-7.20 (m, 1H), 7.35-7.38 (m, 2H), 7.50-7.64 (m, 4H), 7.77-7.82 (m, 2H), 7.89-8.06 (m, 5H); $^{13}$C NMR (CDCl$_3$) δ (Ppm): −4.25, 11.07, 14.02, 18.32, 18.48, 22.94, 23.82, 25.77, 28.99, 29.03, 30.54, 30.58, 39.00, 39.15, 69.98, 103.58, 104.06, 114.81, 118.67, 120.21, 121.63, 122.41, 126.82, 127.14, 127.18, 127.49, 127.87, 128.06, 128.34, 129.36, 129.52, 129.65, 129.70, 129.80, 129.83, 129.87, 129.96, 130.00, 130.29, 131.67, 133.11, 133.94, 134.46, 134.75, 135.26, 135.92, 137.05, 148.83, 153.79, 155.69, 155.89, 166.21; Mp 213-215° C.; FD-MS: 901 (M$^+$).

Example 6

Synthesis of 2,6-bis(2-ethylhexyloxy)-9-(2-(6-benzyloxynaphthyl))-10-(2-(6-t-butyldimethylsiloxynaphthyl))anthracene (Compound 6)

Compound 3 (7.0 g, 9.7 mmol) was dissolved in 50 mL of acetone and potassium carbonate (2.96 g, 21.4 mmol) and catalytic amount of crown 18-6 were added. To this mixture was added benzyl bromide (1.67 g, 9.7 mmol). The reaction was heated to reflux overnight under nitrogen. Potassium carbonate was filtered off and the filtrate was evaporated. The crude product was purified by column chromatography on silica gel with hexane/methylene chloride as an eluent to give 2.3 g of pure product as greenish yellow solid (29% yield). $^1$H NMR (CDCl$_3$) δ (Ppm): 0.74-1.60 (m, 30H), 3.66 (d, J=5.4 Hz, 4H), 5.17 (s, 1H), 5.27 (s, 2H), 6.90-6.92 (m, 2H), 6.98 (dd, J$_1$=9.5 Hz, J$_2$=2.2 Hz, 2H), 7.19 (dd, J$_1$=8.8 Hz, J$_2$=2.4 Hz, 1H), 7.30-7.58 (m, 12H), 7.81-7.97 (m, 6H). $^{13}$C NMR (CDCl$_3$) δ (ppm): 11.09, 14.01, 22.94, 23.78, 29.00, 30.52, 39.02, 70.03, 70.16, 103.90, 107.17, 109.51, 118.08, 119.42, 120.10, 126.53, 126.98, 127.22, 127.60, 128.10, 128.25, 128.68, 129.06, 129.20, 129.70, 129.78, 129.92, 13.00, 130.06, 130.24, 133.77, 133.85, 134.71, 134.82, 136.85, 153.64, 155.70, 157.03. Mp 85-87° C.; S: 808 (M$^+$).

Example 7

Synthesis of 2,6-bis(2-ethylhexyloxy)-9-(2-(6-benzyloxynaphthyl))-10-(4-vinylbenzyloxy))anthracene (Compound 7)

Compound 6 (1.85 g, 2.3 mmol) was dissolved in 20 mL of acetone and potassium carbonate (0.47 g, 3.43 mmol) and catalytic amount of crown 18-6 were added. To this mixture was added 4-vinyl benzyl chloride (0.52, 3.43 mmol). The reaction was heated to reflux overnight under nitrogen. Potassium carbonate was filtered off and the filtrate was evaporated. The crude product was purified by column chromatography on silica gel with hexane/ethyl acetate (95/5) as an eluent to give 1.7 g of pure product as bright yellow solid (80% yield). $^1$H NMR (CDCl$_3$) δ (Ppm): 0.74-0.84 (m, 12H), 1.17-1.37 (m, 16H), 1.53-1.60 (m, 2 H), 3.66 (d, J=5.4 Hz, 4H), 5.26-5.32 (m, 5H, 4 benzylic H and 1 vinyl H), 5.76-5.85 (m, 1H), 6.71-6.82 (m, 1H), 6.91 (d, J=2.1 Hz, 2H), 6.98 (dd, J$_1$=9.5 Hz, J$_2$=2.3 Hz, 2H), 7.32-7.58 (m, 17H), 7.84 (d, J=8.9 Hz, 2H), 7.90 (s, 2H), 7.95 (d, J=8.3 Hz, 2H). $^{13}$C NMR (CDCl$_3$) δ (ppm): 11.11, 14.02, 22.95, 23.80, 29.02, 30.53, 39.04, 70.00, 70.15, 103.87, 107.16, 109.73, 119.40, 120.10, 126.49, 126.97, 127.16, 127.21, 127.59, 127.78, 128.09, 128.24, 128.67, 129.20, 129.69, 129.78, 129.91, 130.08, 133.76, 134.83, 134.94, 136.38, 136.58, 155.71, 157.03. Mp 121-122° C.; MS: 924 (M$^+$).

Example 8

Synthesis of Polymer 17 from Compound 7

Compound 7 (0.70 g) was dissolved in 7 mL of toluene and AIBN (6 mg) was added. The solution was purged with nitrogen for 10 min. and heated to 60° C. overnight. The solution was poured into 60 mL of methanol, and the precipitated polymer was dried filtered, redissolved in toluene and precipitated again from hexane. The resulting bright yellow polymer was dried under vacuum at 45° C. overnight.

Example 9

Synthesis of Polymer 22 from Compound 5

Polymer 22 was prepared similarly as polymer 17 as described above.

EL Device Fabrication and Performance

Example 10

An EL device satisfying the requirements of the invention was constructed in the following manner. The organic EL medium has a single layer of the organic compound described in this invention.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P Trial Product A14083 from H. C. Stark) was spin-coated onto ITO under a controlled spinning speed to obtain thickness of 500 Angstroms. The coating was baked in an oven at 110° C. for 10 min.

c) A toluene solution of a polymer (300 mg in 30 mL of solvent) was filtered through a 0.2 μm Teflon filter. The solution was then spin-coated onto PEDOT under a controlled spinning speed. The thickness of the film was between 500-1000 Angstroms. On the top of the organic thin film was deposited a cathode layer including 15 angstroms of a CsF salt, followed by a 2000 angstroms of a 10:1 atomic ratio of Mg and Ag. Alternatively, the cathode layer includes 1500 angstroms of Ca and 500 angstroms of Ag.

The above sequence completed the deposition of the EL device. The device was then hermetically packaged in a dry glove box for protection against ambient environment.

Figure 2:
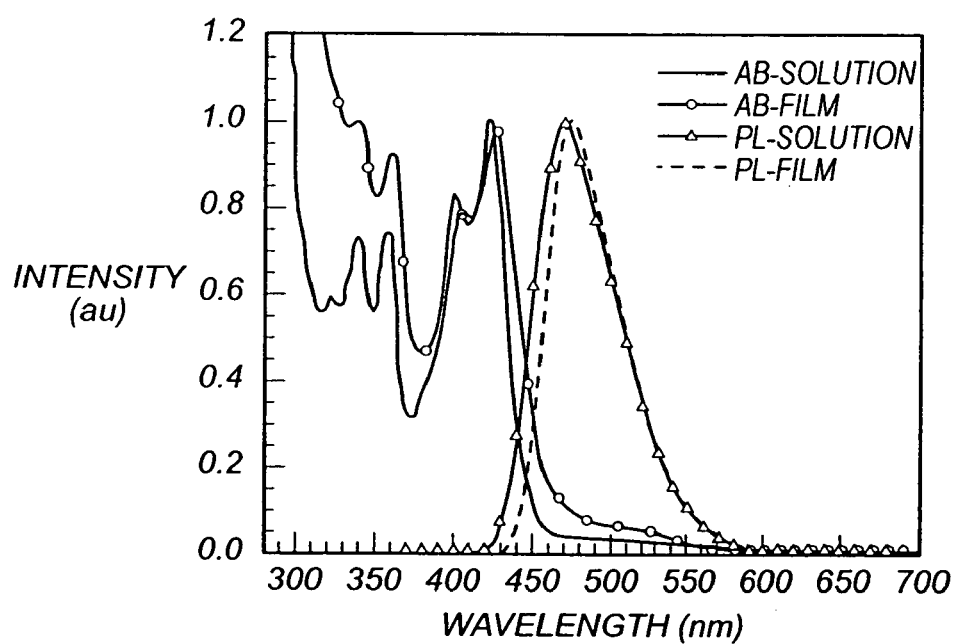
FIG. 2 illustrates the absorption (AB) and photoluminescence (PL) spectra of polymer 22 in solution and thin film.
Figure 3:
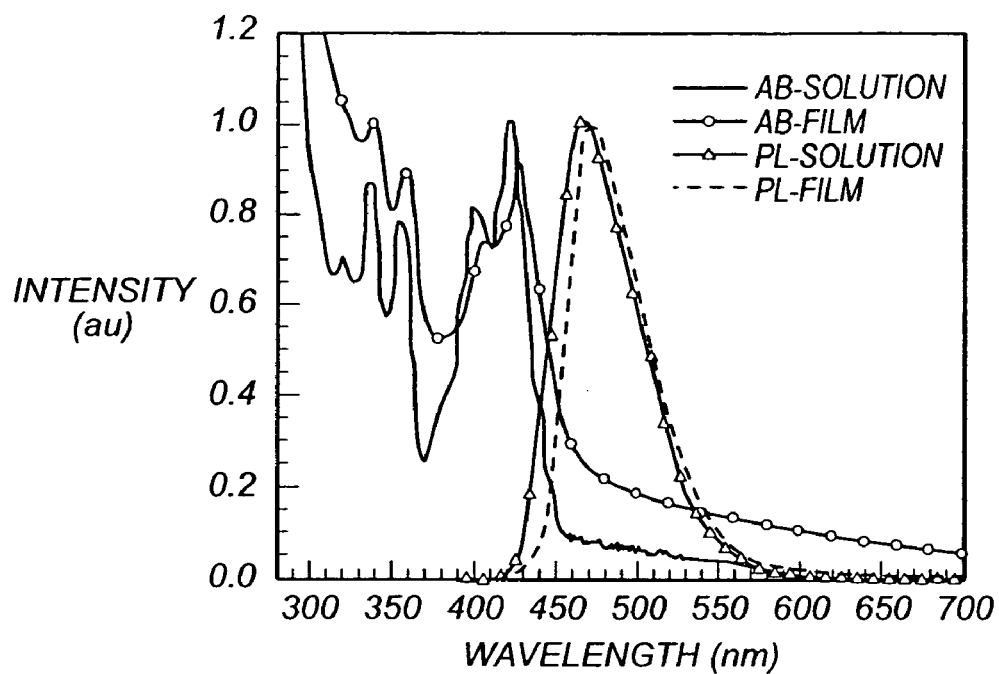
FIG. 3 illustrates the absorption (AB) and photoluminescence (PL) spectra of polymer 17 in solution and thin film.
Figure 4:
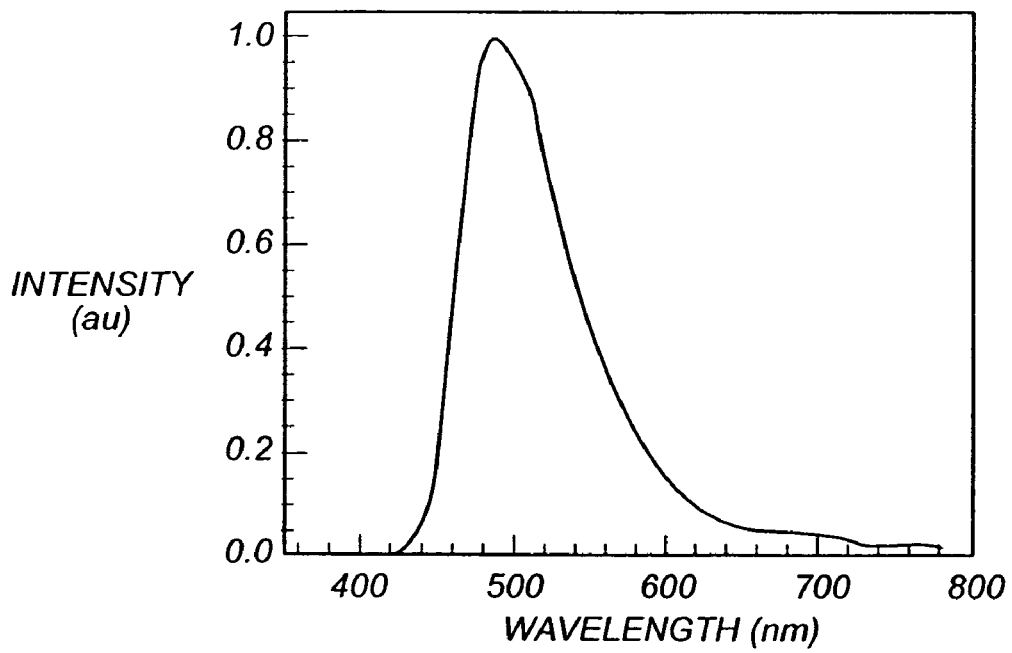
FIG. 4 illustrates the EL spectra of device fabricated from polymer 22: ITO/PEDOT/polymer 22/Ca/Ag.

Table 1 summarizes the characterization of the polymers prepared in the present invention. Absorption (AB) and photoluminescence (PL) spectra were obtained from solid thin films of the polymers and EL spectra were obtained from EL devices: ITO/PEDOT/polymer/CsF/Mg:Ag or ITO/PEDOT/polymer/Ca/Ag. The fabrication of EL devices was illustrated in Example 10. FIGS. 2 and 3 show the absorption (AB) and photoluminescence (PL) spectra of polymer 22 and 17 in solution and thin film respectively. FIG. 4 shows the EL spectra of device fabricated from polymer 22: ITO/PEDOT/polymer 22/Ca/Ag.

TABLE 1

Characterization of polymers according to Examples

| Polymer | M$_w$[a] | PDI | T$_d$ (° C.) | T$_g$ (° C.) | AB[b] (λ$_{max}$ nm) | PL[c] (λ$_{max}$ nm) | EL (λ$_{max}$ nm) |
|---|---|---|---|---|---|---|---|
| 17 | 23800 | 1.48 | 334 | 105 | 338 | 474 (340) | 504 |
| 22 | 48200 | 4.77 | 386 | 113 | 426 | 474 (340) | 484 |

[a]weight average molecular weight, determined by size exclusion chromatography in THF using polystyrene standard
[b]as solid state thin film
[c]as solid state thin film, the number in the parenthesis is the excitation wavelength The polymers of the present invention can be used in emissive layer, and doped with one or more fluorescent dyes, phosphorescent dopants, or other light-emitting materials, or used without dopants, or the polymers can be used as charge transport materials, or can be used both as charge transport materials and emissive materials.

The invention has been described in detail with particular reference to certain preferred embodiments thereof, but it will be understood that variations and modifications can be effected within the spirit and scope of the invention.

PARTS LIST 101 substrate
103 anode
105 hole-injecting layer (HIL)
107 hole-transporting layer (HTL)
109 light-emitting layer (LEL)
111 electron-transporting layer (ETL)
113 cathode
250 current/voltage source
260 electrical conductors

The invention claimed is:

1. A naphthylanthracene-based polymer comprising a repeating unit of the formula

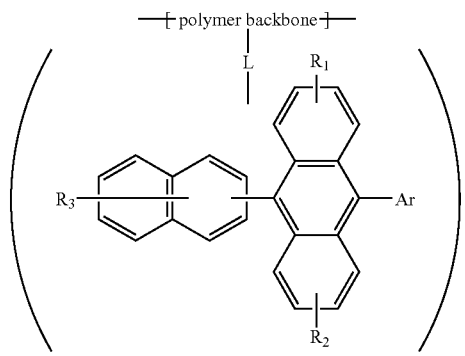

wherein:
Ar is an aryl or substituted aryl of from 6 to 60 carbon atoms; or a heteroaryl or substituted heteroaryl of from 4 to 60 carbon atoms;
$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group; and
L is a direct bond between naphthylanthracene and polymer backbone or a carbon linking group having 1 to 40 carbon atoms or a non-carbon linking group.

2. The polymer of claim 1 wherein the polymer backbone includes a vinyl polymer backbone, polyether, polythioether, polyamine, polyacetylene, polycarbonate, polyurethane, polysulfone, polyimide, polyamide, polyurea, poly(ether ketone), polyester, polyketone, polysiloxane, polyarene, poly(arylene vinylene), or poly(arylene acetylene).

3. The polymer of claim 1 wherein the polymer backbone is a vinyl polymer backbone, a poly(arylene vinylene), or a polyarene.

4. The polymer of claim 1 wherein Ar is a phenyl or a substituted phenyl, a naphthyl or a substituted naphthyl, a biphenyl or a substituted biphenyl, a fluorene or a substituted fluorene, or a thiophene or a substituted thiophene.

5. An electroluminescent device includes an anode, a spaced-apart cathode, and polymeric materials disposed between the spaced-apart anode and cathode, the polymeric materials include pendant naphthylanthracene-based polymers having a repeating unit of the formula

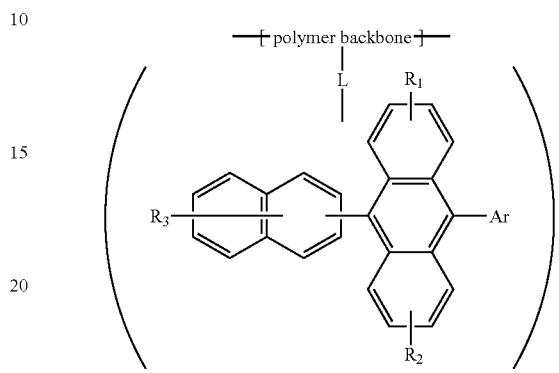

wherein:
Ar is an aryl or substituted aryl of from 6 to 60 carbon atoms; or a heteroaryl or substituted heteroaryl of from 4 to 60 carbon atoms;
$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group; and
L is a direct bond between naphthylanthracene and polymer backbone or a carbon linking group having 1 to 40 carbon atoms or a non-carbon linking group.

6. The electroluminescent device of claim 5 wherein the polymer backbone includes a vinyl polymer backbone, polyether, polythioether, polyamine, polyacetylene, polycarbonate, polyurethane, polysulfone, polyimide, polyamide, polyurea, poly(ether ketone), polyester, polyketone, polysiloxane, polyarene, poly(arylene vinylene), or poly(arylene acetylene).

7. The electroluminescent device of claim 5 wherein the polymer backbone is a vinyl polymer backbone, a poly(arylene vinylene), or a polyarene.

8. The electroluminescent device of claim 5 wherein Ar is a phenyl or a substituted phenyl, a naphthyl or a substituted naphthyl, a biphenyl or a substituted biphenyl, a fluorene or a substituted fluorene, or a thiophene or a substituted thiophene.

9. A method of making an electroluminescent device, comprising:
a) providing an anode and a spaced-apart cathode; and
b) depositing a polymer between the anode and spaced-apart cathode and including a polymer having pendant naphthylanthracene-based structure represented by repeating unit of the formula

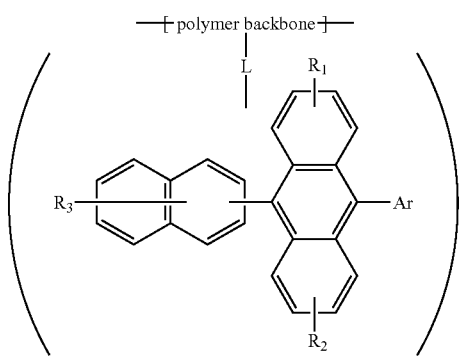

wherein:
Ar is an aryl or substituted aryl of from 6 to 60 carbon atoms; or a heteroaryl or substituted heteroaryl of from 4 to 60 carbon atoms;
$R_1$, $R_2$, and $R_3$ are the same or different, and are each individually hydrogen, or alkyl, or alkenyl, or alkynyl, or alkoxy, or amino, or thioalkyl, or carboxyl, or carbonyl, wherein the alkyl, alkenyl, alkynyl, alkoxy, amino, thioalkyl, carboxy, or carbonyl can have from 1 to 40 carbon atoms; or aryl of from 6 to 60 carbon atoms; or heteroaryl of from 4 to 60 carbon atoms; or F, or Cl, or Br; or a cyano group; or a nitro group, or a sulfonate group; and
L is a direct bond between naphthylanthracene and polymer backbone or a carbon linking group having 1 to 40 carbon atoms or a non-carbon linking group.

* * * * *